(12) United States Patent
Lauermann et al.

(10) Patent No.: US 12,253,803 B2
(45) Date of Patent: Mar. 18, 2025

(54) APPARATUS AND METHOD FOR OPTICALLY PROCESSING AN OBJECT

(71) Applicants: Karlsruher Institut fur Technologie, Karlsruhe (DE); Vanguard Photonics GmbH, Eggenstein-Leopoldshafen (DE)

(72) Inventors: Matthias Lauermann, Karlsruhe (DE); Christian Koos, Siegelsbach (DE); Philipp-Immanuel Dietrich, Wörth (DE)

(73) Assignees: Karlsruher Institut fur Technologie, Karlsruhe (DE); Vanguard Photonics GmbH, Eggenstein-Leopoldshafen (DE)

( * ) Notice: Subject to any disclaimer, the term of this patent is extended or adjusted under 35 U.S.C. 154(b) by 895 days.

(21) Appl. No.: 17/309,642

(22) PCT Filed: Dec. 12, 2019

(86) PCT No.: PCT/EP2019/084911
§ 371 (c)(1),
(2) Date: Dec. 16, 2021

(87) PCT Pub. No.: WO2020/120685
PCT Pub. Date: Jun. 18, 2020

(65) Prior Publication Data
US 2022/0043354 A1     Feb. 10, 2022

(30) Foreign Application Priority Data
Dec. 13, 2018    (DE) .......................... 102018221670.3

(51) Int. Cl.
*G03F 7/20*       (2006.01)
*B29C 64/264*    (2017.01)
(Continued)

(52) U.S. Cl.
CPC .......... *G03F 7/2041* (2013.01); *B29C 64/264* (2017.08); *G02B 21/16* (2013.01);
(Continued)

(58) Field of Classification Search
CPC ... G03F 7/70341; G03F 7/2041; G02B 21/33; B29C 64/264
See application file for complete search history.

(56) References Cited

U.S. PATENT DOCUMENTS 3,556,633 A     1/1971    Mutschmann et al.
5,610,683 A *   3/1997    Takahashi ........... G03F 7/70341
                                                                355/53
(Continued)

FOREIGN PATENT DOCUMENTS

DE      102010007728 A1    9/2011
DE      102014101172 A1    7/2015
(Continued)

OTHER PUBLICATIONS

Serbin, J. et al., Fabrication of woodpile structures by two-photon polymerization and investigation of their optical properties, Optics Express 12(21), pp. 5221-5228, 2004, 8 pages, Jan. 1, 2004.
(Continued)

*Primary Examiner* — Steven H Whitesell
(74) *Attorney, Agent, or Firm* — Woodhart, Emhardt, Henry, Reeves & Wagner, LLP

(57) ABSTRACT

The invention relates to an apparatus (10) and a method for optically characterizing or processing an object (60), and to an object transport unit (55). The apparatus (10) comprises an object carrier (50) for receiving an object (60); an optical characterization or processing unit (15), comprising at least one device for producing or for receiving light (140) and an objective (40) for exposing the
(Continued)

object (60) using the light (140) or for capturing the light (140) from the object (60), wherein the objective (40) has an end face (46) facing the object carrier (50), wherein the end face (46) has an edge (47), wherein the objective (40) further defines an optical axis (502);

at least one membrane (100) introduced between the objective (40) and the object carrier (50), wherein the membrane (100) has a portion (120) configured for penetration by the light (140), wherein at least the portion (120) of the membrane (100) is movable in the axial direction with respect to the optical axis (502), at least one membrane holder (80) for holding the at least one membrane (100), and at least one immersion medium (160) which is at least introduced between the membrane (100) and the object carrier (50), wherein the membrane (100) and the membrane holder (80) are fastened at a point outside of the objective, and wherein the membrane (100) is arranged at the membrane holder (80) in a manner that first contact points (81) between the membrane (100) and the membrane holder (80) are located on or outside a lateral surface (510) which is formed by a geometric extrusion of the edge (47) of the objective (40) parallel to the optical axis (502).

The apparatus (10), the method and the object transport unit (55) facilitate the optical characterization or processing of an object (60) in a manner that meets the specific needs of high-throughput industrial applications.

15 Claims, 12 Drawing Sheets

(51) Int. Cl.
  *G02B 21/16* (2006.01)
  *G02B 21/33* (2006.01)
  *G03F 7/00* (2006.01)
(52) U.S. Cl.
  CPC ......... *G02B 21/33* (2013.01); *G03F 7/70341* (2013.01); *G03F 7/70416* (2013.01)

(56) References Cited

U.S. PATENT DOCUMENTS

| | | | | |
|---|---|---|---|---|
| 5,870,223 | A | 2/1999 | Tomimatsu | |
| 7,570,343 | B2* | 8/2009 | Dodoc | G03F 7/7015 355/72 |
| 2004/0114117 | A1 | 6/2004 | Bleeker | |
| 2005/0158673 | A1 | 7/2005 | Hakey et al. | |
| 2006/0164721 | A1* | 7/2006 | Uhl | G02B 21/025 359/383 |
| 2006/0203218 | A1* | 9/2006 | Shirai | G03F 7/70341 355/53 |
| 2007/0024982 | A1* | 2/2007 | Stickel | G03F 7/70341 359/649 |
| 2008/0106711 | A1* | 5/2008 | Beierl | G03F 7/70891 355/30 |
| 2012/0218535 | A1* | 8/2012 | Thiel | B33Y 30/00 355/53 |
| 2015/0138520 | A1 | 5/2015 | Gellrich et al. | |
| 2015/0277094 | A1 | 10/2015 | Eastman et al. | |
| 2016/0299426 | A1 | 10/2016 | Gates et al. | |
| 2021/0237345 | A1* | 8/2021 | Xia | B29C 64/277 |

FOREIGN PATENT DOCUMENTS

| | | |
|---|---|---|
| DE | 102015221044 A1 | 5/2017 |
| EP | 2801855 A1 | 11/2014 |
| WO | 2004077123 A2 | 9/2004 |
| WO | 2007065711 A1 | 6/2007 |
| WO | 2011141521 A1 | 11/2011 |

OTHER PUBLICATIONS

Bueckmann, T. et al., Tailored 3D Mechanical Metamaterials Made by Dip-in Direct-Laser-Writing Optical Lithography, Adv. Mater. 24, pp. 2710-2714, 5 pages, Jan. 1, 2012.

Obata, K. et al., High-aspect 3D two-photon polymerization structuring with widened objective working range (WOW-2PP), Light: Science and Applications 2, 4 pages, p. e116., Jan. 1, 2013.

He, F. et al., Towards Flexible Glass: Ultra-Thin Glass with Tight Dimensional Tolerance and High Strength Achieved by Ion Exchange, SID Symposium Digest of Technical Papers, 2017, Seite 48., 4 pages, Jan. 1, 2017.

Kayaku Advanced Materials, http://www.microchem.com/pdf/SU8_50-100.pdf. Retrieved Jun. 10, 2021. Retrieved from the Internet: http://www.microchem.com/pdf/SU8_50-100.pdf, 9 pages, Dec. 7, 2018.

* cited by examiner

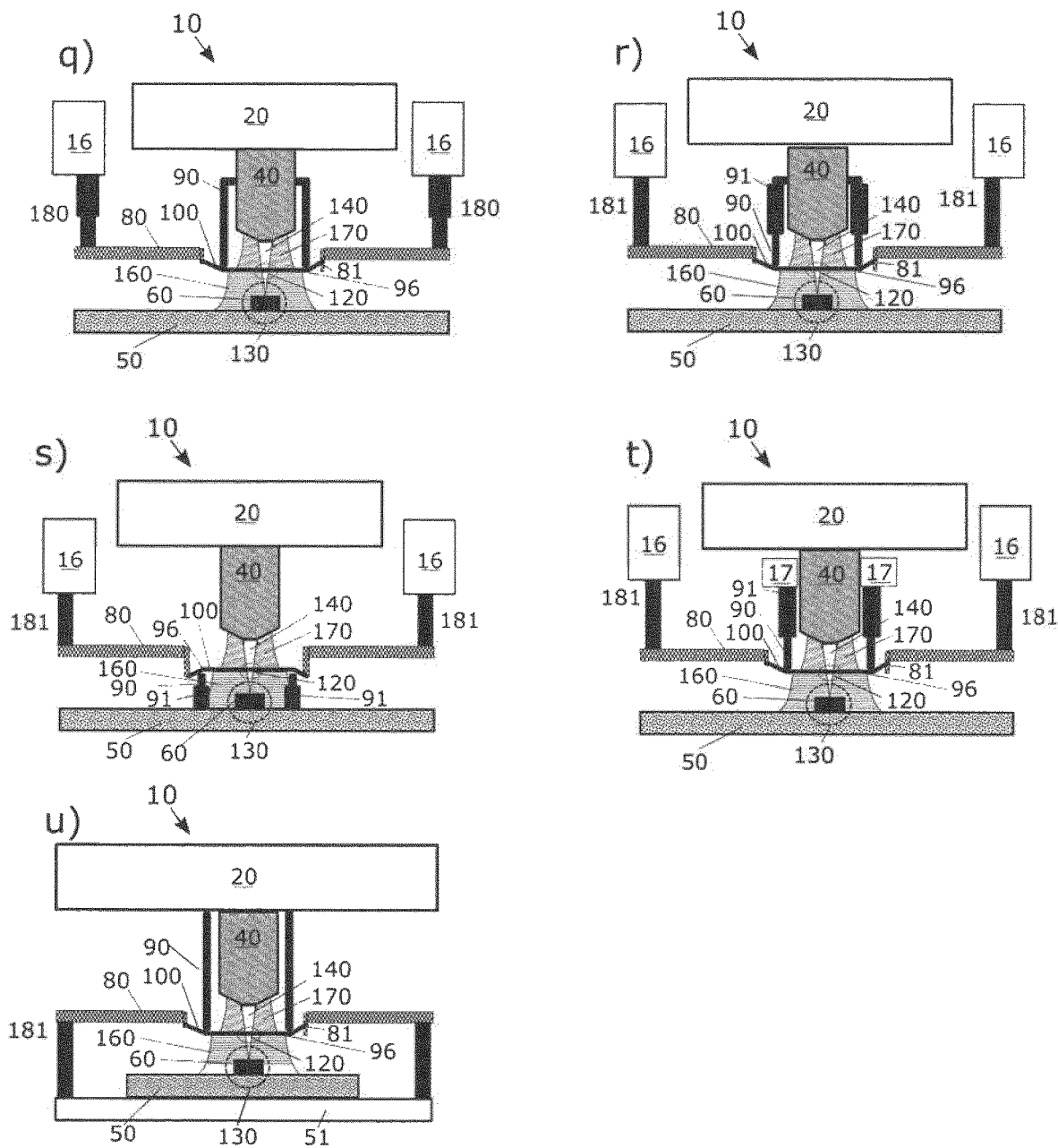

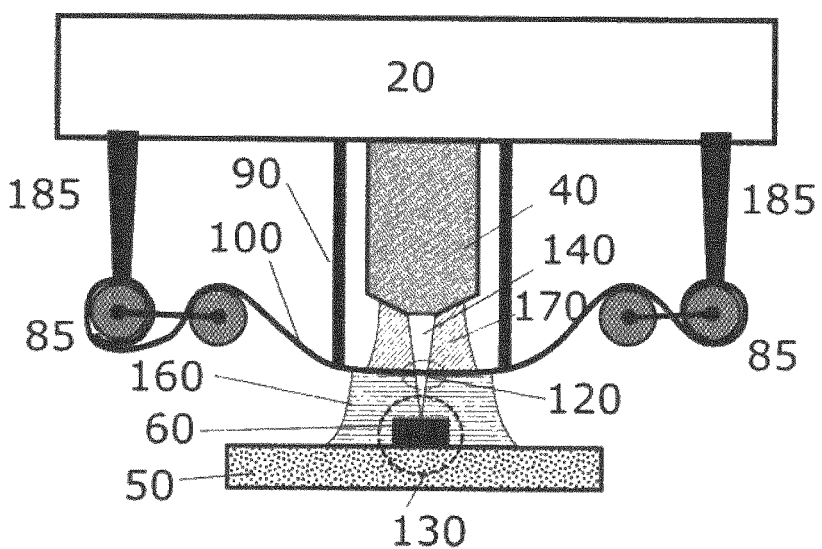
Fig. 9
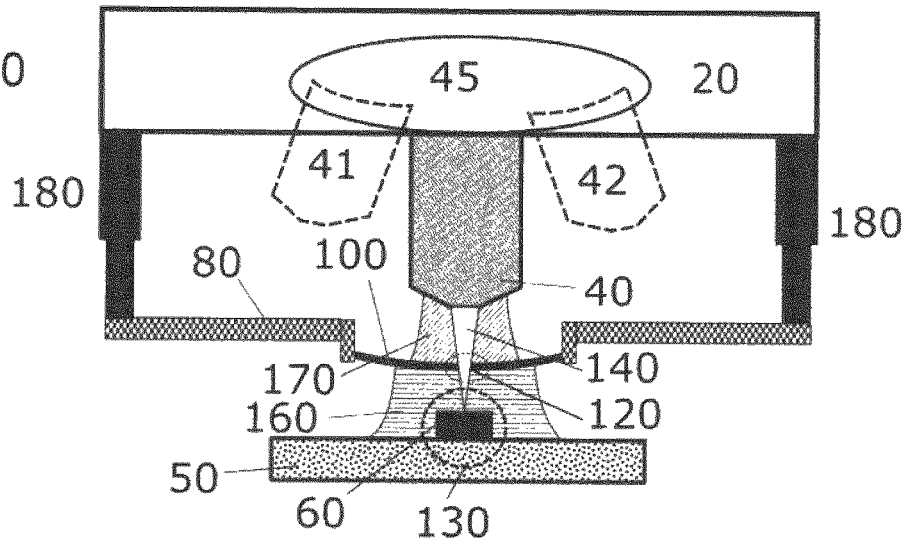
Fig. 10
Fig. 11
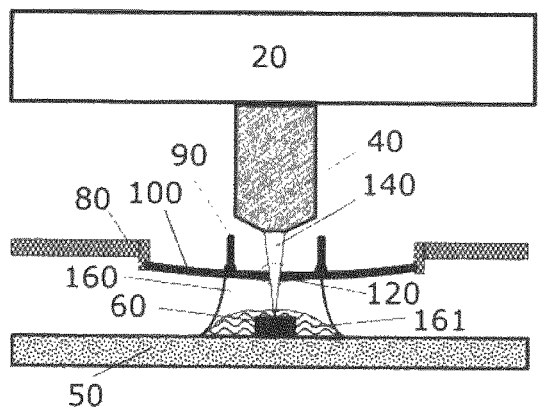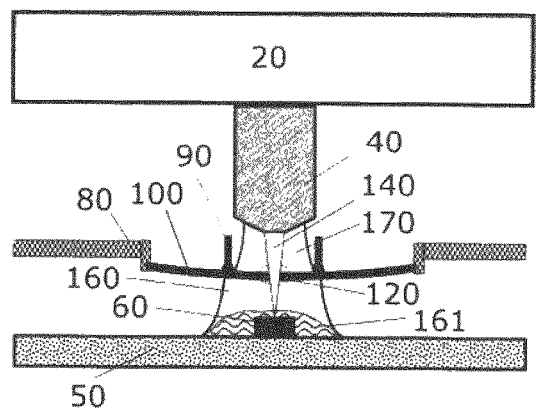

APPARATUS AND METHOD FOR OPTICALLY PROCESSING AN OBJECT

FIELD OF THE INVENTION

The present invention lies in the field of optical 3D lithography and imaging and relates to an apparatus and a method for optically characterizing or processing an object and to an object transport unit. The apparatus, the method, and the object transport unit facilitate, in particular, handling of immersion media and/or photoresists in three-dimensional direct writing laser lithography or in the three-dimensional optical characterization of samples.

In direct writing laser lithography methods, a structure can be defined by moving a focused laser beam in the volume of a liquid or solid photosensitive material, which is referred to as "photoresist", which structure can be exposed in a subsequent development step. In order to achieve high precision and resolution, the light used for patterning should be radiated into the photoresist through an outer boundary surface in a manner that no, or at most the least possible, interference in the beam profile of the incident light occurs. This generally requires a well-defined interface with optical quality in terms of smoothness and flatness, especially when high-resolution, three-dimensional structures are produced using multiphoton polymerization. For exposure, use can preferably be made of focusing optical units, preferably lens-based objectives with the highest possible numerical aperture (NA), in order to obtain a very small focus volume. In connection with a pulsed laser beam, very high optical intensities can briefly be achieved in this focus volume, which in a limited spatial area can lead to multiphoton absorption and thus to initiation of a polymerization reaction. To increase the NA and thus the peak intensities that can be achieved, so-called immersion lithography methods are often used, in which the light used for patterning is radiated into and focused in a single immersion medium or an arrangement of a plurality of immersion media, each of which has a refractive index of n greater than 1. The objectives with high NA used here usually have a small working distance, typically at most 10 mm, preferably at most 1 mm, particularly preferably at most 500 µm or less.

Analogous to high-resolution lithography, the high-resolution optical characterization of objects is also largely based on the fact that the light used for characterization can be coupled into a highly refractive immersion medium surrounding the structure to be imaged through a well-defined interface with no or as little interference as possible.

PRIOR ART

J. Serbin et al., *Fabrication of woodpile structures by two photon polymerization and investigation of their optical properties*, Optics Express 12 (21), pp. 5221-5228, 2004, describes handling of immersion liquids and photoresists in 3D direct writing laser lithography using a thin cover glass. Here, the photoresist is first applied to a substrate encompassing the object and covered by the cover glass, which is stationary in relation to the substrate and in direct contact with the photoresist. Then the objective with high NA used for lithography and/or imaging is brought close to the top of the cover glass and the gap between the cover glass and objective is filled with immersion oil adapted to the refractive index. A disadvantage thereof is that this cannot be used to write structures of any desired height since the working distance of the objective and the thickness of the cover glass specify a maximum height of the structures. In the case of objectives with a high NA, the working distance is relatively short and is often of the order of a few hundred micrometers. At the same time, the utilized cover glasses have a thickness of 100-200 µm in order to achieve sufficient rigidity for a well-defined interface of high optical quality. This limits possible structure heights to a few hundred micrometers. Furthermore, the fixed distances between the object and the cover glass can lead to geometric aberrations if the writing is not carried out uniformly at a certain depth for which the objective and the utilized immersion liquid or the photoresist are designed.

K. Obata et al., *High-aspect 3D two-photon polymerization structuring with widened objective working range (WOW-2PP)*, Light: Science & Applications 2, page e116, 2013, describes an arrangement in which the cover glass is not fastened to the object, but directly to the objective. This allows the objective, together with the cover glass, to be moved freely in relation to the object. The distance between the objective and the cover glass can be configured in a manner here that the focus of the light beam lies in the volume of the photoresist directly below the cover glass. Furthermore, a refractive index-adapted immersion oil can be introduced between the cover glass and the objective. This can be used to write structures of any height. A disadvantage thereof, however, is that the cover glass fastened to the objective moves relative to the object when the objective is positioned. As a result, forces might be produced in the photoresist, which forces lead to opposite forces acting on the objective and/or the substrate and/or to a relative movement between the substrate and layers of the immersion medium adjoining the substrate. This can make accurate positioning of substrate and objective in relation to one another more difficult and, as a result of introducing shearing forces into the photoresist, can additionally lead to damage to structures already present on the substrate, particularly if these structures are particularly small and/or have high aspect ratios. Further, an automatic exchange of the objective can only be carried out with difficulty during the operation of the apparatus: Since the cover glass is fastened directly to the objective, physical contact between the cover glass and the photoresist adjoining on the object side is invariably lost when an objective is exchanged. This can also produce forces in the photoresist which can lead to damage of already produced optical structures, or problems may arise when reestablishing optical contact between the photoresist and a newly introduced objective. A further disadvantage consists of the fact that this procedure is not suitable for lithographic patterning of objects with a high surface topography. The distance between the objective and the cover glass is configured in a manner that the focal point of the light beam lies in the volume of the photoresist immediately below the cover glass. In the case of objects with a pronounced surface topography, a collision between the cover glass fastened to the object and parts of the object can arise during the writing procedure, and so portions of the object may be destroyed. Moreover, the photoresist might flow if the objective with the associated cover glass is moved too far away from the object. A further disadvantage consists of the fact that forces may be exerted on the objective when exchanging the cover glass fastened to the objective and these may cause a misalignment of the optical system. By way of example, such an exchange of the cover glass may be necessary in order to avoid a cross-contamination in the case of successively exposed substrates.

US 2016/0299426 A1 describes an apparatus which additionally comprises a transparent element that is fastened to the objective and configured to protect the objective from contamination. This apparatus is substantially subject to the same restrictions as the approach described by K. Obata et al.; see above. Moreover, the utilized volume of photoresist cannot be adapted to the structure to be written in this case either since the transparent element is securely attached to the objective and must always fill the entire space between the axially movable objective and the object. Further, it is necessary to precisely adapt the refractive index of the photoresist to the utilized objective since no further degrees of freedom are provided for compensating monochromatic aberrations. This significantly curtails the spectrum of usable photoresists and leads to disadvantages when implementing stable lithography methods in industrial surroundings, for example as a consequence of a temperature dependence or of aging of the photoresist or on account of variations in the composition of the initial materials used to produce the photoresist.

WO 2011/141521 A1 and US 2012/0218535 A1 each describe an apparatus and a method for 3D lithography using two-photon polymerization, in which the objective is directly immersed in the photoresist; in this case, a cover glass or any other element situated between the objective and the object is dispensed with. This can likewise be used to produce structures of any height. However, forces may also be exerted on the objective or introduced into the photoresist in this case when there is a movement of the objective relative to the object, said forces being accompanied by the above-described disadvantages. Further, an exchange of the objective during the operation of the apparatus in this approach invariably also leads to loss of physical contact between the objective and the photoresist adjoining on the object side. Moreover, it is also not possible in this case to adapt the amount of photoresist to the structure to be written since the entire volume between the objective and the object must always be filled with the photoresist which serves as a homogeneous immersion medium. Further, there is also the risk here of the objective being contaminated as a result of the contact with the photoresist, which serves as immersion medium and is in direct contact with the object, or of a cross-contamination of objects possibly arising by way of remains of photoresist adhering to the objective. Further, the objective itself is exposed to the development of the photoresist, which over time may lead to damage to, e.g., seals or cements of the objective in the case of corresponding compositions of the photoresist. Moreover, there may be an unwanted polymerization of the liquid photoresist on the exit window of the objective, for example as a consequence of short wavelength light which is intentionally or unintentionally radiated into the objective, as a result of which the objective can be damaged or destroyed. These aspects are particularly disadvantageous for an industrial process since regular cleaning of the objective means a significant loss of time during the production. A further disadvantage consists of the fact that the refractive index must also be adapted precisely to the objective in this case. Moreover, these concepts do not allow an object that has been covered by a photoresist to be transferred to various functional units and, in the process, do not afford the photoresist protection from contamination, unwanted irradiation by short wavelength light or contact with oxygen or humidity.

US 2005/0158673 A1 discloses an apparatus for 2D immersion lithography, in which the immersion liquid is encapsulated in a balloon formed from a thin membrane. The balloon filled with immersion liquid is positioned between the objective and the object in a manner that it is in contact with both the objective and the object. As a result, an immersion objective can be used for high resolution 2D lithography and can be protected from contamination. Further, the method proposed here is restricted to solid photoresists since liquid photoresists would be displaced from the object by the pressure of the liquid-filled balloon. Further, in the case of solid photoresists, the application is restricted to cases where the photoresist has a very plane surface of optical quality.

U.S. Pat. No. 7,570,343 B2 discloses an apparatus and a method for projection lithography, using which 2D structures are produced on substantially planar objects, which typically have a maximum unevenness of the order of one or a few light wavelengths of the lithography radiation. This document proposes the introduction of a projection light-transmissive termination element in the object-side light path of the system, it also being possible to use the termination element for separating two immersion liquids. The termination element can be either a solid plate with a macroscopic thickness or a thin membrane. In the process, the position of the termination element between the object and the objective can be set by way of appropriate adjustment elements when setting up the system. Micrometer screws which are arranged in an interstice between an end face of the objective and the object are proposed as adjustment elements. Alternatively, the position of the membrane can be moved by way of the hydrostatic pressure of the adjoining immersion liquids. Further, by way of a suitable geometric design, the termination element can serve to correct aberrations of the lithography device. In the case of a flexible membrane, the geometric design can also be achieved by varying the hydrostatic pressure of the immersion liquids adjoining on both sides.

The position of the termination element between the objective and the object is set once when the lithography device is configured, for example manually using micrometer screws; a change of this position during the writing procedure is not desired. Moreover, patent document U.S. Pat. No. 7,570,343 B2 only relates to the application of the projection lithography to plane substrates, in the case of which there is no need for an axial relative movement of the objective with respect to the object during the exposure process. This allows the use of large objectives with a large working distance and nevertheless a high NA, said objectives being very heavy. Furthermore, the lithography device can be operated with a small safety margin between the termination element and the object. As a result of the large working distance of the objective and the small safety margin, it is possible to introduce comparatively large optical or mechanical assemblies into the spatial region between the end face of the objective and the object, said assemblies reducing the usable working distance of the arrangement to a fraction of the working distance of the objective. Thus, the termination elements proposed herein are in part designed as solid plates with a macroscopic thickness, which themselves fill a majority of the installation space between the end face of the objective and the object, or else they have mechanical positioning elements that are also introduced between the end face of the objective and the object. A variation in the hydrostatic pressure of the immersion liquid on at least one side of the membrane is described as an alternative option for positioning a transparent termination element that is designed as a thin membrane. However, it is not only the position but also the curvature of a flexible membrane that changes in the case of a change in pressure; i.e., position and refractive power of the membrane cannot be set independently of one another by varying the pressure. Further, setting the pressure requires a relatively large volume of immersion liquid; this is disadvantageous in view of a minimization of the volume of photoresist in the case where a photoresist serves as an immersion liquid. Further, setting the position by way of hydrostatic pressure requires at least one hermetically sealed region which comprises part of the objective, the entire objective, or the sample; this is not practical in many application situations.

WO 2004/077123 A2 discloses a microscopic system comprising a plurality of exchangeable objective lenses; an interchange element for the objective lenses for holding each objective lens, wherein the interchange element is configured to place a selected objective lens into an optical axis of the microscopic system, wherein each objective lens is held by the interchange element in a manner that each objective lens is coaxially movable in relation to the optical axis and in relation to the interchange system; and an actuator element for moving the selected objective lens in coaxial fashion in relation to the optical axis and with respect to the interchange system in order to focus the selected objective lens in relation to a sample.

US 2007/0024982 A1 discloses an imaging system of a microlithographic projection exposure apparatus for obtaining improvements in the projection of exterior optical surfaces from contamination. In an imaging system comprising a projection objective configured to project an image of a mask which can be placed into a position in an object plane onto a light-sensitive coating, which can be placed into a position in an image plane, a membrane which is substantially transparent to an operating wavelength of the projection objective is arranged in a manner with respect to the exterior optical surface of the projection objective that an interstice configured to receive a liquid or gaseous medium is formed between the optical surface and the membrane.

T. Bückmann, N. Stenger, M. Kadic, J. Kaschke, A. Frölich, T. Kennerknecht, C. Eberl, M. Thiel and M. Wegener, *Tailored 3D Mechanical Metamaterials Made by Dip-in Direct-Laser-Writing Optical Lithography*, Adv. Mater. 24, pp. 2710-14, 2012, describe the production of three-dimensional metamaterials using direct laser writing.

OBJECT OF THE INVENTION

Based hereon, it is the object of the present invention to provide an apparatus and a method for optically characterizing or processing an object as well as an object transport unit, which at least partly overcome the disadvantages and restrictions of the prior art.

The apparatus and the method should, in particular, facilitate handling of immersion media and/or photoresists in 3D direct writing laser lithography or in the 3D-optical characterization of samples, which, in particular, meet the requirements of industrial applications in the field of high throughput lithography and characterization methods. A problem often arising in this context is that of the immersion medium used for lithography or for imaging being in physical contact with the objective and the substrate. For this purpose, use is often made of a liquid immersion medium which is applied to the substrate and which is in direct contact with an exit window of the objective at the same time. Below, the term "substrate" describes one or more interconnected solids, on which a target structure should be produced by lithography and/or a structure present should be optically characterized. In the text below, it is used synonymously with the term "object". Below, an "exit window" denotes an optically transparent window that is integrated in the objective or connected to the latter by way of direct physical contact, through which light enters into an immersion medium adjoining the objective or light is received from the latter. In particular, an exit window can also be the termination lens of the objective or a glass plate, coating or film that protects this termination lens. While the use of a continuous liquid immersion medium between the exit window and the substrate represents a simple and reliable procedure for obtaining high optical resolutions within the scope of laboratory applications, it is less suitable for use in industrial optical characterization or 3D lithography methods, in particular for the reasons set forth below, and it is accompanied by various restrictions within the scope of practical handling. These restrictions of the above-described prior art relate in particular to the following points:

Transmission of contaminations between objective and substrate: In the case of high throughput characterization or 3D lithography methods, a single objective is used to process a multiplicity of substrates within a short period of time, with each substrate coming into direct physical contact with the immersion medium of the objective. Between the exchange of the substrates, it is not possible or not practical to clean the objective by way of the complete removal of residues of the immersion medium that adhere to the objective. This can lead to instances of cross-contamination, i.e., the transfer of contamination from one substrate to one or more other substrates.

Damage to the objective: In the case of 3D direct writing laser lithography methods, the photoresist can simultaneously serve as an immersion medium which is in direct physical contact with the exit window of the objective. In the process, there is the risk of an unwanted polymerization of the liquid photoresist occurring on the exit window of the objective, especially as a consequence of short wavelength light which is intentionally or unintentionally radiated into the objective. This can have a destruction of the objective as a consequence. Further, there is the risk of the photoresist chemically attacking and destroying or aging constituent parts of the objective, such as seals or cements, for example. The same risk arises in the case of photoresists that can only be removed from the objective by aggressive solvents which have a damaging effect on parts of the objective.

Use of objectives which have a small working distance: In 3D direct writing laser lithography, use is often made of objectives which have a very short working distance of a few hundred micrometers. Such a short working distance is advantageous in that the objective can have a compact configuration with a small diameter and low weight, even in the case of high NA, and consequently facilitates a fast movement of the objective during the writing procedure. However, the available installation space between objective and substrate is significantly curtailed by objectives with a short working distance. Apparatuses and methods for handling immersion media and/or photoresists in 3D lithography and imaging should therefore be designed in a manner that they curtail the usable working distance of the objective, i.e., a distance between the focal plane of the objective and the optical or mechanical component closest to the focal plane in the direction of the objective, as little as possible.

Lithographic production of high structures using objectives with a short working distance: For the lithographic production of functional components, it is often advantageous to be able to produce structures whose height exceeds the working distance of the objective.

Introduction of forces into the immersion medium and/or the objective: The objective is often moved in a lateral or axial fashion relative to the substrate in the case of high throughput characterization or 3D lithography methods. In this case, an axial relative movement usually serves to set the focal plane and hence, in particular, to address different depths of a 3D structure to be produced or characterized. In particular, a lateral movement can serve to produce or capture structures whose lateral dimensions exceed the field of view or the writing field of the objective that is addressable using a beam scanner. In both cases, a relative movement between the objective and the substrate can introduce forces into the immersion medium which forces lead to opposite forces acting on the objective and/or the substrate and/or can lead to a relative movement between the substrate and layers of the immersion medium adjoining the substrate. In the process, the opposite forces acting on the objective and/or the substrate can make accurate positioning of substrate and objective relative to one another more difficult. Moreover, structures on the substrate might be damaged as a result of a relative movement between the substrate and the layers of the immersion medium adjoining the substrate, in particular if the structures are particularly small and/or have large aspect ratios and consequently are particularly susceptible to the movement of the photoresist surrounding these.

Automated objective change, stability of the adjustment of the optical system, and fast movement of the objective: To facilitate a fast movement of the objective in an axial and/or lateral direction, especially to increase the throughput, it is advantageous to keep the mass of the objective and assemblies fastened thereto as low as possible. This allows the forces that act on the objective when the apparatus is operated and/or when the method is carried out to be minimized, which forces might lead to a gradual or sudden misalignment of the objective. Moreover, it should be possible to exchange the objective during operation, where possible automatically, for example using an objective revolver, without altering the position of the substrate in the process or without causing disturbances in the immersion medium or in the photoresist in the vicinity of the substrate. For instance, such disturbances can be caused by contact being lost between the exit window of the objective and the immersion medium adjoining on the object side or the photoresist.

Automated application of the immersion medium and transfer within production chains: In the case of automated procedures, it may often be advantageous to carry out the application of the immersion medium, in particular the immersion liquid, on the substrate on the one hand and the lithographic processing or the optical characterization of the substrate on the other hand in a manner spatially separated from one another in different functional units. In this context, it would be advantageous to transfer the substrates which are covered by the immersion medium between two different functional units under normal ambient conditions, as far as possible without impairment, in particular without the occurrence of contamination or unwanted exposure, without special requirements in respect of cleanliness (e.g., cleanroom quality), exposure (e.g., yellow light surroundings) and/or atmosphere (e.g., low oxygen or low humidity surroundings) having to be observed in a spatial region that is crossed during the transfer. As a result, it could be possible within the scope of lithographic patterning for the substrate to be transferred to a second functional unit that serves for patterning ("lithography unit") following a local application in a first functional unit ("dispenser") of a liquid photoresist that serves as immersion medium, without needing to comply with cleanroom conditions at all times during the transfer or needing to ensure that there is no irradiation by daylight or other UV-containing radiation spectra in the process. Moreover, it would be advantageous in many cases if it could be possible to at least largely avoid contact of the photoresist with certain substances, such as oxygen or moisture in the air. Furthermore, it would be desirable to have a high mechanical stability of a drop which is formed on the substrate by the photoresist following application and which can tend to flow in the case of appropriate surface energies between the substrate and the photoresist.

Lithographic patterning using dry objectives: To avoid the above-described disadvantages, it could be expedient to dispense with the use of an immersion objective and instead use a so-called "dry objective", which is not in direct physical contact with the immersion medium. This is always possible if the NA required for the respective application is less than 1 and hence can also be attained without an immersion objective. However, the challenge that might arise here in the case of liquid immersion media or photoresists is that of creating a well-defined interface with optical quality, through which light can be coupled into the immersion medium or the photoresist and can also be output coupled therefrom again, without disturbances that cannot be calculated. However, the use of a glass plate, through which light from the free space can be radiated into a liquid medium and can be output coupled again, is ruled out in many cases since this further reduces the usable object-side working region of the objective that is restricted in any case as a result of an often short working distance. The creation of a well-defined optical interface can also constitute a problem whenever there is an application of solid immersion media or photoresists on substrates with high surface topographies or significant height variations, which transfer to corresponding height variations in the surface of the photoresist when a solid photoresist is applied. Disturbance-free input coupling of a light beam for high resolution lithographic patterning in the volume of a solid photoresist with a pronounced surface topography is not possible using an air objective. One example of an object with a pronounced surface topography that should be processed by lithography are so-called optical "multi-chip modules", i.e., a plurality of individual chips of different thickness assembled on a common object carrier, which for example can be complemented by optical elements, e.g., micro-lenses or free form waveguides (so-called "photonic wire bonds") by way of direct writing lithography methods. Therefore, it would be desirable to also be able to use dry objectives for patterning or imaging in liquid photoresists or in solid photoresists with a very uneven surface topography, and in the process curtail the usable working distance of the objective as little as possible on the object side.

Consumption of photoresist in 3D direct writing immersion lithography: In three-dimensional direct writing immersion lithography, the photoresist itself is used as only immersion medium in many cases. This can lead to high consumption of photoresist since, as a rule, the latter fills the entire spatial region between objective and substrate, while in fact only a fraction thereof is required to produce a target structure. This can be disadvantageous, in particular, when producing small structures or in the case of objectives with a large working distance, since the volume to be filled is particularly large in these cases. Therefore, it would be advantageous to minimize the consumption of photoresist and, in the process, set a process amount as optimally as possible, ideally even when the apparatus is in operation and/or the method is carried out.

Adapting the immersion medium to avoid aberrations: To obtain high resolutions, it is advantageous to match the refractive index of the immersion medium as accurately as possible to the refractive index of the objective in order to avoid or minimize aberrations. Below, the term "aberrations" denotes deviations from ideal optical imaging which would lead to ideal aberration-free imaging or to a smallest possible focal volume of the light beam used for optical characterization or lithographic processing. This contains both geometric or monochromatic aberrations, which arise from the geometric-optical beam paths and the refractive indices occurring along the latter and which already occur in the case of monochromatic lithography or imaging light, and chromatic aberrations, which result from a wavelength dependence of the refractive index of the materials present in the beam path. In the case of direct writing lithography methods with a photoresist serving as immersion medium, the compensation of aberrations may require a precise adaptation of the refractive index of the photoresist, in particular by way of specific, precisely set mixtures made of different initial substances. This is accompanied by a restriction in usable process parameters and possible materials. It would be advantageous to be able to process various photoresists with at least small variations in the refractive index and be able during the operation to compensate aberrations occurring in the process. In the process, it should be possible to be able to address a range of depths for imaging or for lithographic patterning that is as large as possible using a once obtained aberration compensation.

DISCLOSURE OF THE INVENTION

This object is achieved by an apparatus and a method for optically characterizing or processing an object and by an object transport unit, which have the features of the independent patent claims. Advantageous developments, which are realizable individually or in any desired combination, are provided in the dependent claims.

The terms "have," "include," or "comprise," or any desired grammatical deviations therefrom will be used below in a non-exclusive manner. Accordingly, these words can relate both to situations in which no further features in addition to the features introduced by those words are present, and to situations in which one or more further features are present. For example, the expression "A has B", "A includes B", or "A comprises B" can relate both to the situation in which no further element in addition to B is present in A (i.e., to a situation in which A consists only of B), and to the situation in which, in addition to B, one or more further elements are present in A, such as element C, elements C and D, or even further elements.

It should furthermore be pointed out that the expressions "at least one" and "one or more" and grammatical deviations of these expressions when used in connection with one or more elements or features, if said expressions are intended to express that the element or feature may be provided once or multiple times, are generally only used once, for example upon first introduction of the feature or element. If the feature or element is subsequently mentioned again, the corresponding term "at least one" or "one or more" is generally not used again, without limiting the possibility that the feature or element may be provided once or multiple times.

Furthermore, the words "by preference", "preferably", "in particular", "for example", or similar words are used below in connection with optional features without alternative embodiments being limited hereby. For example, features which are introduced by these words are optional features, and there is no intention of limiting the scope of the claims and in particular of the independent claims by these features. For example, the invention, as will be understood by a person skilled in the art, can also be performed using different configurations. Similarly, features introduced by way of "in an embodiment of the invention" or by way of "in an exemplary embodiment of the invention" are understood to be optional features, without alternative configurations or the scope of the independent claims being intended to be limited hereby. Furthermore, these introducing expressions are not intended to touch upon all possibilities of combining the features introduced hereby with other features, be it optional or non-optional features.

In a first aspect, the present invention relates to an apparatus for optically characterizing or optically processing an object. In this case, the term "object" or "substrate" denotes an individual solid or at least two interconnected solids, wherein a target structure should be produced on the at least one solid using lithography and/or an already present structure should be characterized by optical means. In this case, the object can comprise an individual solid or an arrangement of individual objects which are applied on a common base plate and, for example, can form so-called "multi-chip modules". In this case, the object is applied to an object carrier which can preferably be applied to an object stage that carries the object carrier. Here, the term "object carrier" denotes an arrangement which is configured to receive the object. Here, the term "object stage" is used as a designation for a positioning stage which is configured to receive the object or the object carrier and which facilitates a positioning, as accurate as possible in space, of the object and of the object carrier in the working space of an optical characterization or processing unit, which is described in more detail below. The object carrier can be configured as an object-protecting object transport unit or can be integrated in an object transport unit.

In the following, the term "optical characterization or optical processing" describes methods which are used for three-dimensionally (3D) spatially resolved manipulation of material properties of an object or for three-dimensionally spatially resolved capture of information in relation to an object. In this case, a resolution relevant to the manipulation or capture can preferably be better than 20 μm, particularly preferably better than 5 μm, in particular better than 1 μm, in all three spatial directions. The methods used here can preferably be so-called "direct writing methods", in which the spatially resolved manipulation or capture of the object is implemented in at least one volume region that is localized in all spatial directions in the simplest case, which volume region can be moved using scanning methods through the entire region to be patterned or captured. By way of example, the volume region can be produced in the form of at least one spatially significantly localized focal spot of light beams with a high numerical aperture (NA), in particular in the case of two-photon lithography, in which substantially focused laser beams are used, or in the case of laser scanning microscopy (LSM; point scanners). In two-photon lithography, a femtosecond laser is preferably used to produce ultrashort pulses of laser beams, wherein the ultrashort pulses bring about a high peak intensity and hence a high probability of two-photon processes. In this case, the pulse duration is preferably no more than 5 ps, particularly preferably no more than 1 ps, in particular no more than 250 fs. The wavelength of the laser beams is preferably from 200 nm to 2000 nm, particularly preferably from 400 nm to 1700 nm, in particular from 500 nm to 1070 nm. Further applications can lie in the manipulation or the capture of the object by producing a substantially linearly (1D) or areally (2D) extended volume region, within which a 1D or 2D spatially resolved manipulation or capture of the object is possible as a result of optical irradiation or detection and which additionally is moved by way of a suitable scanning method in one spatial direction or in two spatial directions through the three-dimensional region to be patterned or captured (line or area scanner). Examples of this include the 3D spatially resolved capture of objects by recording a stack of images at various depths (z-stack), preferably connected with a numerical reconstruction of the three-dimensional object. In these methods, a spatial resolution that is as good as possible in the z-direction is inseparably connected to an axial movement, which is as precise as possible, of the objective relative to the object during the writing procedure or the recording procedure, and to a small depth of field, which is achieved by a high NA. Therefore, these methods differ, in particular, from methods for 2D lithography (e.g., projection lithography) and for 2D imaging, in which information capture or patterning with a spatial resolution in the axial direction is not used, and which therefore can make do without an axial movement of the objective relative to the object and do not necessarily require a small depth of field.

It is emphasized that problems arising in direct writing lithography also apply in a similar or the same fashion to imaging methods that make use of an immersion medium. All problems and solutions described above and below for lithography methods are therefore transferable to analogue problems and solutions in relation to the optical characterization, even if this is not expressly specified in individual cases. Therefore, as is also true below, the term "optical characterization or processing unit" describes a device that is configured either for optical characterization or for optical processing of the object. Below, this device is also referred to in simplified fashion as a "lithography unit", this not intending to preclude a functionality for the optical characterization of objects.

The proposed apparatus for optically characterizing or optically processing an object comprises at least
 an object carrier for receiving an object;
 an optical characterization or processing unit, comprising
  at least one device for producing or for receiving light and an objective for exposing the object using the light or for capturing the light from the object, wherein the objective has an end face facing the object carrier, wherein the end face has an edge, wherein the objective further defines an optical axis;
 at least one membrane introduced between the objective and the object carrier, wherein the membrane has a portion configured for penetration by the light, wherein at least the portion of the membrane is movable in the axial direction with respect to the optical axis,
 at least one membrane holder for holding the at least one membrane, and
 at least one immersion medium which is at least introduced between the membrane and the object carrier,
wherein the membrane and the membrane holder are fastened at a point outside of the objective, and wherein the membrane is arranged at the membrane holder in a manner that first contact points between the membrane and the membrane holder are located on or outside a lateral surface which is formed by a geometric extrusion of the edge of the end face of the objective parallel to the optical axis.

Consequently, the proposed apparatus comprises a membrane that is movable in the axial direction or at least one portion of the membrane that is movable in the axial direction and an immersion medium, in particular an immersion liquid, which is introduced in a manner between the objective and the object to be processed lithographically or to be characterized optically that it is in direct physical contact with the object but isolated from the objective by the membrane. In this case, the term "membrane" denotes an article which is formed by a flexible solid, which has substantially a two-dimensional extent and a thickness, wherein the extent exceeds the thickness by at least a factor of 10, preferably by at least a factor of 50, in particular by at least a factor of 100. In a preferred embodiment, the membrane is present in the form of a thin flexible film which can preferably have a thickness ranging from 10 µm to 250 µm, particularly preferably from 15 µm to 100 µm, in particular from 25 µm to 50 µm. The thin flexible film can preferably be introduced and removed automatically by way of an arrangement of rollers or sliding surfaces. Hence, it is possible when changing the object to also remove from an interaction region of the object an object-side region of the membrane contaminated by, for instance, adhering residues of a first immersion liquid or a photoresist and to replace said contaminated region by a new membrane or a new region of the membrane without adhering substances. Alternative embodiments of the membrane comprise, e.g., ultra-thin glass or thin plates made of other optically transparent and mechanically flexible substances. In particular, the membrane can bring about the isolation of the first immersion medium, which is in direct physical contact with the object, in the direction of the objective. What is rendered possible as a result is that, for example, a first preferably liquid immersion medium or a photoresist covers the object while an exit window or an end face of the objective is situated in air or introduced into a second immersion medium, in particular a second immersion liquid. What this can avoid, in particular, is that there can be unwanted crosslinking of the photoresist on the exit window of the objective or an accumulation of contamination from the photoresist on the objective in the case of direct writing laser lithography. Further, this can avoid a contamination via the object of the objective or of the second immersion medium in contact with the latter. Further, this can avoid the risk of cross-contamination when the object is exchanged. In a preferred embodiment, the membrane can be chosen in a manner that it is impermeable to the media in contact therewith or to constituents of these media and that it is not chemically attacked by these substances, even in the case of relatively long or continuous exposure.

The term "axial mobility" of the portion of the membrane penetrated by the light in this case describes an embodiment of the apparatus in which the axial position of the portion can be set in relation to the objective and/or the object. In a particular embodiment, the axial position of the portion of the membrane penetrated by the light can be varied relative to the object over a range which is preferably more than 20%, particularly preferably more than 40%, very particularly preferably more than 60% of the nominal working distance of the objective. In a further embodiment, the axial position of the portion of the membrane penetrated by the light can be varied relative to the objective over a range which is preferably more than 20%, particularly preferably more than 40%, very particularly preferably more than 60% of the nominal working distance of the objective.

Particularly in conjunction with the optical processing of the object, preferably in a lithography method, the term "immersion medium" denotes a solid or liquid substance or a gel-like mixture, which is penetrated by the light beam before a polymerization reaction is initiated, preferably in the vicinity of the focal spot of the light beam. In this case, a liquid photoresist can itself serve as an immersion medium, or use can be made of layered arrangements which can comprise a solid photoresist applied to a substrate and one or more layers of immersion oils or transparent plates. In a manner analogous thereto, an "immersion medium", particularly in the context of the optical characterization of an object, is understood to mean a solid or liquid substance which is penetrated by the light beam used for imaging on its path between the objective and the object. This can be a liquid substance, such as, e.g., an immersion oil or a photoresist, or a solid substance, such as, e.g., a glass, a polymer, or a mixture or combination of polymers. By way of example, these materials can be present in the form of a plane parallel layer or can surround the object to be examined on the objective side. When combining optical processing and optical characterization of the object, the photoresist used for the lithographic patterning can also serve as immersion medium for the imaging. The term "photoresist" denotes a photosensitive, light-sensitive material, preferably a polymer, which, for example, belongs to the group of acrylates, methyl methacrylates, epoxides or ormocers. A wavelength of the electromagnetic spectrum, preferably in the visible, infrared, or ultraviolet optical spectral range, matched to the absorption properties of the selected light-sensitive material is chosen for exposure purposes. The exposure of the photoresist by the light beam can cause a change in a property of the light-sensitive material in the process, in particular a change in a solubility of exposed portions of the light-sensitive material, wherein, depending on selected material, the solubility can be reduced (so-called negative-tone photoresist) or increased (so-called positive-tone photoresist). Depending on the type of change, it is consequently possible within the scope of a development step that follows the at least one exposure step to remove the exposed portions of the light-sensitive material in the positive-tone photoresist or the unexposed portions of the light-sensitive material in the negative-tone photoresist, as a result of which it is possible to obtain the desired structure on the object.

Since the membrane is introduced between the objective and the object, it reduces a usable working distance on the object side; this is disadvantageous, particularly in the case of lithographic processing or optical characterization of objects with a significant surface topography, such as optical multi-chip modules, for example. Below, the term "usable working distance on the object side" or simply "usable working distance" d" is understood to mean the distance between the focal plane of the objective and the optical or mechanical component, such as the membrane, for example, which is closest to the focal plane in the direction of the objective. The reduction in the usable working distance on the object side can preferably be minimized by the choice of a thin membrane. In a preferred embodiment, the thickness of the membrane can be chosen to be thinner than a third of the working distance, particularly preferably thinner than a sixth of the working distance, in particular thinner than a tenth of the working distance. For an exemplary objective with a working distance of 300 µm, the thickness of the membrane can therefore preferably be chosen to be no more than 100 µm, particularly preferably no more than 50 µm, in particular no more than 30 µm. A loss of rigidity accompanied by a thinner membrane can be compensated for by the introduction of tensile forces that act in the lateral direction into the membrane, preferably using a tension ring or using tension rollers, which are integrated in the membrane holder or which form the membrane holder. As a result, it is possible to provide very plane optical interfaces, the effect of which on the phase fronts of the light penetrating therethrough is known very accurately, even in the case of very thin membranes.

The light used for lithographic processing or optical characterization of the object, which light can be a laser beam in particular, can be coupled into or output coupled from the immersion medium adjacent on the object side at least through the transparent portion of the membrane. In this case, the term "transparent" denotes a property of at least the portion of the membrane which consists in little damping of the transmission over a wavelength range of the light used for processing or for characterization, wherein the damping of the transmission is preferably less than 1 dB, particularly preferably less than 0.25 dB, in particular less than 0.1 dB. In this case, the transparent portion of the membrane either can form a well-defined optical boundary, the effect of which on phase fronts of the light penetrating therethrough is very accurately known and which can therefore be compensated for by appropriate aberrations of adjacent spatial regions, or can have an "optically neutral" behavior. The term "aberrations" denotes deviations from ideal optical imaging which would lead to ideal aberration-free imaging or to a smallest possible focal volume of the light beam used for optical characterization or for lithographic processing. In this context, this can be, firstly, geometric or monochromatic aberrations, which arise from the geometric-optical beam paths and the refractive indices occurring along these beam paths and which already occur in the case of monochromatic lithography or imaging light, and, secondly, chromatic aberrations, which result from a wavelength dependence of the refractive index of the materials present in the beam path. The term "optically neutral" describes that the geometric aberrations caused by the transparent portion of the membrane are negligible. Optical neutrality can preferably be achieved by virtue of use being made of a membrane that is very thin at least in the transparent portion, said membrane being in contact with an immersion medium on both sides, or by a membrane which, in the transparent portion, does not differ, or only has minor differences, in terms of the refractive index in the wavelength range relevant to the optical patterning or characterization from immersion media adjacent on both sides. In the case of a transparent portion of the membrane that is optically neutral in this sense, the disturbance of the phase fronts penetrating through the portion can preferably be equal or be less than $\lambda/4$, particularly preferably less than $\lambda/10$, in particular less than $\lambda/20$, where the disturbances of the phase front are specified as equivalent path difference in fractions of a wavelength $\lambda$.

The membrane is attached to a membrane holder and has a portion that is transparent to the light used for characterizing or processing the object, with the axial position of said portion being able to be set relative to the objective using at least one positioning element, in particular during the writing procedure, in a preferred embodiment. In this case, both the membrane and the membrane holder are fastened to a point outside of the objective, which is understood to mean that neither the membrane nor the membrane holder are fastened to the objective itself, the term "not fastened to the objective" meaning that there is no direct force fit, interlocking, and/or integral mechanical connection in all spatial directions between the membrane or the membrane holder and a constituent part of the objective, in particular a mount, a housing, or a transparent element of the objective, using which forces acting on the membrane are transferred in full or predominantly to the objective. What is avoided by the proposed embodiment of the membrane and the membrane holder is that the forces which occur during a relative movement between membrane and object and which are exerted by the immersion medium or the photoresist on the preferably large-area membrane are transferred directly and without attenuation to the objective and are therefore able to make highly accurate dynamic positioning of the objective more difficult. Instead, the membrane holder can be fastened to a further part of the optical characterization or processing unit, wherein, in contrast to the objective, the further part is not a constituent part of the optical beam path, in which the requirements in respect of precision and dynamics of the positioning are lower, and wherein the further part can absorb at least some of the forces acting on the membrane. In this case, a time-averaged magnitude of the forces transferred from the membrane to the objective can be preferably less than 60%, particularly preferably less than 40%, very particularly preferably less than 30% of the corresponding averaged magnitudes of the forces acting on the membrane overall. The further part of the optical characterization or processing unit can preferably be a positioning stage that can be used to axially and/or laterally displace the objective and that is also referred to as "objective stage" below. Thus, the membrane and the membrane holder can be attached in a stationary fashion relative to the objective without the membrane or the membrane holder exerting forces on the objective itself. Alternatively, the membrane holder can also be fastened to another part of the optical characterization or processing unit, which cannot be moved in the axial direction together with the objective. In particular, this can be the object carrier or an object stage carrying the object carrier. Moreover, it is also possible to fasten the membrane holder to an object transport unit which is suitable for protecting and transporting the object and which is designed as a closed container, for example. This object transport unit can preferably comprise the object carrier, the membrane holder, and the membrane.

A further advantage of a membrane that is not fastened to the objective consists of it allowing the objective to be removed or to be exchanged for another one, without the membrane or the membrane holder being removed or altered. This is preferably advantageous in the case of an optical characterization or processing unit which has an option for automated objective exchange or which is designed in a manner that different types of objectives, even objectives from different manufacturers, can be used. In this case, it is desirable to provide a device for fastening the membrane holder that is independent of the mechanical configuration of the objective. A further advantage of a membrane that is not fastened to the objective consists in the membrane being able to be exchanged easily and automatically, preferably by way of a lateral pivot movement or insertion without forces that can have a disadvantageous effect on the beam alignment being exerted on the objective. In the process, in particular, it is possible to undertake an exchange of the membrane without the membrane or the associated membrane holder being moved significantly toward the object in the axial direction and hence without having to risk damaging the object. Furthermore, the proposed attachment of the membrane prevents additional masses from being fastened to the objective, which additional masses cause forces and/or vibrations in the case of a fast movement of the objective in the axial or lateral direction and are consequently able to impair the quality of the optical imaging or the lithographic patterning.

However, a disadvantage in the case of objectives having a small working distance is that the installation space available between the objective and the object can be significantly curtailed as a result of the use of the membrane and the associated membrane holder. The present apparatus is therefore designed in a manner that it restricts the usable working distance of the objective as little as possible. It can therefore also be applied to objectives with a high numerical aperture (NA) and short nominal working distance, which can be realized in compact fashion with a comparatively small diameter and low weight but in which the installation space available between objective and object is significantly curtailed. At the same time, the present apparatus should allow the usable working distance on the object side to be kept as large as possible. Here, the "working distance usable on the object side", the "usable working distance", or simply the "working distance" denotes a distance between the focal plane of the objective and the optical or mechanical component closest thereto in the direction of the objective; the nominal working distance denotes the distance between the focal plane and the constituent part of the objective closest thereto, for example the exit window. The NA of an objective used in the proposed apparatus can be preferably more than 0.5, particularly preferably more than 0.7, more preferably more than 0.9, in particular more than 1.1. In this case, the nominal working distance of the objective can range between 50 μm and 10 mm, preferably between 80 μm and 2 mm, in particular between 100 μm and 1 mm.

Herein, the apparatus is configured in a manner that no further mechanical elements apart from the membrane itself are introduced in the interstice between an end face of the objective and the object. The term "objective" denotes a focusing element or an arrangement of at least two focusing elements, which are configured to radiate light into the object space or receive light therefrom. In general, the objective can have at least one end face, an edge of the end face, an exit window, and a mount, wherein moreover further components may be provided. According to the present invention, the term "objective" more particularly comprises a housing in addition to the at least one focusing element, said housing being configured, for example, to mechanically hold the at least one focusing element. Further, the objective and the associated optical system have an optical axis, which emerges from the rotational symmetry of the optical faces occurring in the objective, for example. The configuration of the housing of the objective remains unconsidered when defining the optical axis. The term "end face" denotes a face of the objective which faces the object and which comprises an "exit window" of the objective in the form of a transparent portion, wherein the light is able to be emitted in the direction of the object or able to be received from this direction through the exit window. An "exit window" denotes an optically transparent window that is integrated in the objective or connected to the latter by way of direct physical contact, through which light can enter into an immersion medium adjoining the objective or light can be received from the latter. The end face can comprise a plane or curved surface of the exit window and a surface, which surrounds the exit window, of a non-transparent mechanical mount, which has a ridgeline. In this case, the term "mount" denotes a mechanical element which determines the external geometric shape of the objective, which directly adjoins the exit window, and which can encompass the entire housing of the objective. However, in this case only the part of the mount facing the object is relevant to the present invention. In this case, the object-side part of the mount comprises all surface elements of the mount whose normal vectors have an axial component pointing in the direction of the object. A "ridgeline" of the mount is understood to mean a contour which surrounds the optical axis and which is formed by the points that are parallel to the optical axis and that protrude furthest in the direction of the object. Consequently, the term "end face" can be defined as follows using the ridgeline of the mount: The end face comprises at least the exit window of the objective, wherein the end face in the case of a mount adjoining the exit window additionally comprises the region of the mount enclosed by the ridgeline and all points outside of the ridgeline which, in the case of a plane surface of the object aligned perpendicular to the optical axis, have a distance d' from the object which is preferably greater than the maximum distance d of a point on the ridgeline from the surface of the object by less than 5 mm, particularly preferably by less than 1 mm, in particular by less than 300 μm. The end face of the objective consequently forms a simple contiguous area which has an edge. The points of the end face closest to the object need not necessarily be located on the ridgeline of the mount in this case. Thus, in the case of a convexly curved exit window of the objective, the points closest to the object can be located on the exit window itself, for example.

In order to facilitate a stable hold and axial positioning of the portion of the membrane penetrated by the light even without mechanical elements between the end face of the objective and the object, the proposed apparatus comprises a membrane holder connected to the membrane, wherein, according to the invention, the contact points between the membrane and the membrane holder are located on or outside of a lateral surface which is described by a geometric extrusion of the edge parallel to the optical axis, and wherein an arrangement of the contact points between the membrane and the membrane holder within this lateral surface is precluded. In this case, the term "lateral surface" describes the surface formed by the geometric extrusion of the edge of the end face parallel to the optical axis. It can also be understood to be an enveloping surface of a cylindrical body which arises from a geometric extrusion of the end face along the optical axis of the system and which, depending on a profile of the edge, can adopt any cross section, in particular in the form of a circle, an ellipse, or an oval. However, other shapes of the cross section are possible. In this case, the term "geometric extrusion" denotes, as a matter of principle, an increase in the dimensionality of an element, in this case the edge or the end face, by way of a parallel displacement in space, parallel to the optical axis in this case. If the edge of the end face of the objective, which represents a line or curve, is extruded by virtue of pulling the line or the curve along a direction parallel to the optical axis, then the desired lateral surface can be obtained thereby. Thus, this embodiment of the present apparatus renders it possible to advantageously use the installation space available in the axial direction on or outside of the lateral surface for the purposes of configuring the membrane holder without in the process curtailing the usable working distance of the apparatus by way of mechanical elements which, according to the prior art, would be introduced between the end face of the objective and the object.

In a preferred embodiment, the membrane can be positioned very close to the objective such that the reduction in the usable working distance of the apparatus in relation to the nominal working distance of the objective is substantially determined by the thickness of the membrane. In a further preferred embodiment, tensile forces can be introduced into the membrane by the membrane holder, said forces acting in a plane lying perpendicular to the optical axis and allowing the membrane to be tensioned and hence allowing a form of the membrane that is as flat as possible to be achieved, even in the case of a very thin membrane.

In this case, the membrane holder can have a ring-shaped configuration and introduce tensile forces into the membrane which are directed in the radial direction away from the optical axis, or it is possible to use arrangements which introduce tensile forces substantially directed in parallel into the membrane. The term "radial" is understood to mean a direction that is perpendicular to the optical axis; a direction parallel to the optical axis is described by the term "axial". The membrane holder can comprise rollers and/or sliding surfaces and hence facilitate a lateral movement of the membrane between the end face of the objective and the object. This can be advantageous for a simpler exchange of the portion of the surface of the membrane that is in contact with the immersion medium.

In a particularly preferred embodiment, the proposed apparatus comprises a device for setting, during the characterization or processing procedure, the axial position in respect of the object of the portion of the membrane penetrated by the light. To this end, use is made of a one-part or multi-part positioning element which can be brought into contact with the membrane. In this case, the term "during the characterization or processing procedure" denotes a change in the axial position relative to the object of the portion of the membrane penetrated by the light beam, which change in the axial position is implemented in automated fashion during the lithographic patterning or the three-dimensional optical characterization or during a brief interruption of these procedures, without this requiring the object to be removed from the work space of the objective, for example in order to undertake a calibration. The axial mobility in respect of the object of the portion of the membrane penetrated by the light beam yields an advantage during direct writing laser lithography methods in that it is even possible to use objectives with a limited nominal working distance or apparatuses with a limited usable working distance to produce structures of any height by virtue of the objective and the membrane being moved away from the object together during the layer-by-layer construction of the structure. Furthermore, an axial positionability of the portion of the membrane penetrated by the light beam can yield a further advantage of an additional degree of freedom for compensating for optical aberrations in comparison with lithography methods in which the objective is in direct contact with a homogeneous photoresist to be patterned. For this purpose, use can preferably be made of immersion media with different levels of photosensitivity and/or refractive indices and/or viscosities, which are introduced into spatial regions which, on the object side and/or objective side, adjoin the portions of the membrane penetrated by the light. In this case, aberrations can be produced or compensated for in a targeted manner by way of an axial displacement of the portion of the membrane penetrated by the light beam. In this case, multi-photon luminescence radiation, which is produced in the volume of the immersion medium by the light beam used to characterize or process the object and which can be captured by a detection device present in the lithography unit, can serve as an indication for the presence of an advantageous axial position of the membrane. In the case of multi-photon luminescence, the intensity of the luminescence radiation produced depends nonlinearly on the exciting intensity and can be described by a characteristic with positive curvature. Since a high maximum intensity is achieved in the object space in the case of small aberrations, the luminescence is maximal even in the case of a minimal aberration. Thus, the aberration can be minimized by maximizing the captured luminescence power. Thus, by virtue of maximizing the luminescence, an optimal position for the membrane can be found by displacing the membrane and simultaneously observing the luminescence. To capture the luminescence radiation, the lithography unit can be supplemented by a detection device for luminescence. In a preferred embodiment, the power of the light used to excite the multi-photon luminescence is chosen in a manner that no crosslinking reactions or only very weak crosslinking reactions are triggered during the excitation. In this case, a "crosslinking reaction" is understood to mean a chemical reaction in which permanently stable covalent bonds are produced between co-reactants present in the immersion medium. Preferably at least one of the resulting reaction products has a higher molar mass than each reactant involved in the reaction. Hence, the photoresist remains unchanged during the setting procedure for the membrane position or the photoresist changes only to a negligible extent in comparison with the subsequent patterning.

In a further preferred embodiment of the apparatus, a sensor, for example a force sensor or a contact sensor based on electrical currents, can be used to detect a collision between two elements of the apparatus. The detection of such a collision, which may occur, in particular, between membrane holder or membrane and object, object carrier, or object stage, allows the avoidance of a collision and damage resulting therefrom to the objective or other sensitive assemblies by way of appropriate protection mechanisms.

A further advantage of the use of a portion of the membrane penetrated by the light beam and movable relative to the object in the axial direction lies in a reduction of the consumption of photoresist material in 3D direct writing immersion lithography. Thus, an axial positioning as close as possible to the object of the portion which is penetrated by the light allows the volume of the photoresist serving as an immersion medium between the membrane and the object to be reduced to a minimum while a further immersion medium, e.g., an index oil, which can be utilized multiple times can be used on the side of the membrane facing the objective. The axial position of the portion of the membrane penetrated by the light beam being set during the operation allows the volume of photoresist to be flexibly matched to the structure to be produced in each case. In addition or independently thereof, a lateral localization of the photoresist can be achieved by an interaction between the membrane and the photoresist which serves as an immersion medium. Thus, a membrane with adapted wetting properties, particularly in the case of small volumes of photoresist, renders it possible, for example, to prevent a so-called "flow" of a drop of photoresist in the lateral direction by virtue of the photoresist being held between the membrane and the object by surface forces. Lateral structuring on the membrane, in particular, which can change the wetting properties of the membrane in spatially resolved fashion in particular, can also contribute to this end. The lateral structuring can be used both on the side of the membrane facing the object and on the side facing the objective and can be used for the spatially resolved application of immersion media. In addition or as an alternative thereto, additional guide elements which prevent immersion liquids from flowing away in the lateral direction can be used in the case of objectives with a large nominal working distance. In a particular embodiment, these guide elements can also be formed by the positioning elements.

By using two immersion media which are arranged separated from one another by the axially movable, transparent portion of the membrane, it is moreover possible for additional degrees of freedom to arise in respect of the photosensitivity and/or the refractive index and/or the viscosity of the immersion liquid in direct contact with the object. Immersion objectives are typically optimized for a certain refractive index which either homogeneously fills the object-side beam path or surrounds a coverslip with set thicknesses and optical properties in order to achieve minimal geometric aberrations and hence the greatest possible spatial concentration of the optical power in the focal point. When using such objectives in direct writing high-resolution laser lithography, it is therefore important to match the refractive index of the photoresist serving as immersion liquid precisely to the utilized objective. To this end, it is necessary to typically set the refractive index with an accuracy of $10^{-3}$ or better. This not only significantly curtails the spectrum of usable photoresists but problems may also arise when implementing stable lithography methods in an industrial environment. Thus, variations of the refractive index that are of the specified order of magnitude may already be caused by a temperature dependence or aging of the photoresist, or on account of variations in the composition of initial products used to manufacture the photoresist. Moreover, objectives may also have manufacturer tolerances which render the use of objective-specific immersion media, in particular photoresists, necessary; this can only be implemented with difficulty in an industrial context. These problems can be solved by the locally axially movable, transparent membrane as proposed here. By separating the volumes of the immersion media between the objective and the object, it is possible to wet the region facing the object with a photoresist that serves as first immersion liquid, the refractive index of which is not optimally matched to the objective. The aberrations occurring in the process can be compensated for by a suitable choice of the second immersion medium, which is used on the side of the membrane facing the objective and the refractive index of which is chosen for this purpose. In addition to the choice of the refractive index of the second immersion medium, which can differ from the refractive index of the first immersion medium, in particular by a difference of at least 0.005, preferably at least 0.01, the proposed option of axially positioning the portion of the membrane penetrated by the light beam between the objective and the object can also be used to set the totality of aberrations occurring along the beam path as accurately as possible. This can compensate for not only geometric aberrations but also chromatic aberrations by virtue of choosing a second immersion medium with a suitable wavelength dependence of the refractive index or suitable Abbe number. Similarly, a temperature dependence of the refractive index of the first immersion medium and hence the geometric aberrations arising therefrom can be compensated for by the suitable choice of the second immersion medium. As an alternative or in addition thereto, there can preferably be a difference between the viscosity of the first immersion medium and the viscosity of the second immersion medium. In order to create additional degrees of freedom when compensating for aberrations or temperature dependences, it is possible to provide at least one further axial position-adjustable membrane between the object and the objective, between which further immersion media with different refractive indices and Abbe numbers can be inserted.

The at least one positioning element used for the axial positioning of the portion of the membrane penetrated by the light can act either on the entire membrane or only on the portion which is penetrated by the light. To this end, the at least one positioning element can be in permanent mechanical contact with the membrane. Alternatively, this contact can be established before the start of the optical patterning or characterization procedure, for example while objective and object approach one another. In the case where the at least one positioning element only acts on the portion which is penetrated by the light beam, the second contact points between the at least one positioning element and the membrane can preferably be located within a contour which can be described by the above-described first contact points of the membrane with the membrane holder or by a polygon formed by the first contact points with non-intersecting side lines. Further, the at least one positioning element can be designed in a manner that, where possible, it does not interfere with the light beam used for patterning or characterizing the object. To this end, the second contact points between the membrane and the at least one positioning element can preferably be located outside of the portion penetrated by the light beam. In a preferred embodiment, the at least one positioning element is designed in a manner that the second contact points between the membrane and the positioning element are located on or outside of the lateral surface which is described by the geometric extrusion of the edge of the end face of the objective parallel to the optical axis of the system. As a result, it is also possible here to use the installation space available in the axial direction on or outside of the lateral surface for the purposes of configuring the at least one positioning element without, using mechanical elements between the end face of the objective and the object, curtailing the usable working distance of the arrangement in the process. The contact points between the membrane and the at least one positioning element can be discrete individual points, or else a set of points which preferably can form a one-part or multi-part contour that surrounds the optical axis. In a preferred embodiment, it is possible using the at least one positioning element to adjust, over a large further range, the axial position of the portion of the membrane penetrated by the light beam such that the membrane can approach both the end face of the objective and the surface of the object as closely as desired.

In a particular embodiment, the at least one positioning element can be configured in a manner that it has no force fit, interlocking and/or integral connection to the membrane in the lateral direction at the contact points and hence can absorb forces from the membrane acting predominantly in the axial direction. To this end, the at least one positioning element can be configured, in particular, in a manner that it can be moved laterally over the membrane, wherein an optimal axial position with respect to the objective or the object of the portion of the membrane penetrated by the light beam can be achieved at least intermittently, preferably continuously. For this purpose, the at least one positioning element can be designed in a manner that it can laterally slide or roll over the membrane without significant action of force as a consequence of friction and without significant wear on the membrane or on the at least one positioning element itself. As an alternative or in addition thereto, the rollers and/or sliding surfaces of the at least one positioning element can also serve to facilitate a lateral movement of the membrane and hence a simple exchange of the portion of the surface of the membrane which is in contact with the immersion medium, for example in order to prevent contamination.

For a purpose of positioning the portion which is penetrated by the light, there can be a movement of the contact points or of the at least one positioning element in the axial direction relative to the object, said movement either being brought about by actuators specifically provided to this end or by an arrangement in which the at least one positioning element is attached to a further part of the lithography unit and which can be moved together with the latter by way of actuators that are already present. To be able to facilitate an axial movement of the portion of the membrane penetrated by the light beam using the forces introduced by the at least one positioning element, the membrane holder can comprise mechanical degrees of freedom which preferably admit axial sliding of an element securely connected to the membrane relative to a stop of the membrane holder. As an alternative or in addition thereto, the axial mobility of the portion of the membrane penetrated by the light beam can also be based on an elastic or partly elastic deformation of the membrane and/or the membrane holder.

The at least one positioning element used for the axial positioning of the portion penetrated by the light beam or an associated actuator can be attached to a part of the lithography unit or else can be integrated in the object transport unit which is provided to protect and transport the object and which is preferably designed as a closed container. In a particular embodiment, the at least one positioning element can be attached to the objective or to the objective stage. In this case, the at least one positioning element can comprise actuators which are configured to displace the portion of the membrane penetrated by the light beam relative to the objective or to the objective stage in the axial direction. Alternatively, the at least one positioning element can be rigidly connected to the objective or to the objective stage and can be positioned in the axial direction together with the objective or the objective stage in a synchronized movement caused by the same actuator. In this case, an axial position between the objective and the object of the portion of the membrane penetrated by the light beam, which position is advantageous for characterizing or processing the object, can be set during a mutual approach and highly accurate relative positioning of objective and object. In a simple embodiment, part of the objective itself can also play the role of the at least one positioning element, for example by virtue of pressing an objective with a plane or concave end face onto a laterally tensioned membrane in order to slightly deform and/or displace the latter in the axial direction. The part of the objective acting as a positioning element can be, for example, the ridgeline or the edge of the end face of the objective, or a portion of the end face of the objective which is located between the ridgeline and the edge of the objective. Moreover, an objective with a plane exit window or an exit window with convex curvature in the direction of the object can also be used for positioning the portion of the membrane penetrated by the light, in which the exit window has a shorter distance from the object than the mount of the objective. In the case of a flexible membrane, the membrane can cling to the exit window in the process; in the case of a thin optically neutral membrane, this does not lead to any relevant additional aberrations. If the at least one positioning element is attached to the objective as described above, it is advantageous if the forces acting on the objective from a large-area membrane can be at least partly diverted via a membrane holder not attached to the objective instead of being transferred from the positioning elements to the objective in their entirety. Firstly, this can be facilitated by virtue of the positioning elements having no force fit, interlocking and/or integral connection to the membrane in the lateral direction and hence being able to predominantly absorb axially acting forces from the membrane. These axially acting forces can be minimized by virtue of the membrane being tensioned by forces introduced using a lateral, stably designed membrane holder and by virtue of the positioning elements attached to the objective being pressed on the membrane with small forces in the axial direction. In particular, this allows the at least one positioning element to have a compact design and consequently allows the masses additionally fastened to the objective to be kept as low as possible in view of a fast and precise movement of the objective. In an alternative embodiment, the at least one positioning element can be fastened to the object carrier, to the object stage, or to other parts of the lithography unit. In the process, they can preferably comprise actuators using which the portion of the membrane penetrated by the light can be displaced relative to the objective in the axial direction.

In a particular embodiment can be achieved that no forces are transferred from the membrane to the objective by virtue of direct contact between the objective and the membrane being avoided and by virtue of the at least one positioning element not being attached to the objective. This use of a membrane holder not attached to the objective in combination with one or more positioning elements structurally separated from the membrane holder for the axial movement of the portion of the membrane penetrated by the light allows, in particular, forces acting on the objective to be avoided or at least to be reduced by virtue of some of these forces being diverted via the membrane holder to another part of the optical processing or characterization unit which is less sensitive in respect of the action of force. This embodiment is advantageous inasmuch as it allows the membrane holder to be designed to be solid for the purposes of introducing large tensioning forces into a large-area membrane without in the process increasing the masses and inertial forces directly attached to the objective. By contrast, the positioning elements can only facilitate a small displacement of the membrane in the axial direction; in exchange, there is only the need for small forces acting in the axial direction, which can be applied by the objective and which can be transferred to the membrane by way of comparatively small positioning elements. Even if the positioning elements are not attached to the objective itself, the separation of membrane holder or positioning elements is nevertheless advantageous, in particular in view of the option of simply exchanging the membrane or changing the objective without the membrane or the membrane holder being removed or altered. Nevertheless, embodiments are also conceivable in which the membrane holder itself serves as a positioning element and is preferably attached to the objective stage, to the object carrier, to another part of the optical processing or characterization unit, or else to the object transport unit which is suitable for protecting and transporting the object and preferably designed as a closed container.

As already mentioned, the membrane can be a thin flexible film in a preferred embodiment, which film can be tensioned by lateral forces and can be elastically deformed for the axial positioning of the portion of the membrane penetrated by the light beam. As described above, the forces acting in the axial direction, which are required for deformation, can be introduced by way of appropriate positioning elements. The use of a membrane which is tensioned by lateral forces and locally positioned by axial forces is advantageous, in particular, if the intention is to process very large-area objects, the lateral extent of which can be more than 100- or 1000-times the working distance of the objective and which would require great mechanical outlay for positioning a large-area membrane at the right level and with sufficient parallelism with respect to the focal plane of the objective. In a preferred embodiment, the positioning elements serving for the local axial positioning of the portion of the membrane penetrated by the light beam are therefore configured in a manner that these can be moved laterally over the membrane, wherein an optimal axial position relative to the objective of the portion of the membrane penetrated by the light beam is continuously attained. For this purpose, the positioning elements can be designed in a manner that they can laterally slide or roll over the membrane without significant action of force as a consequence of friction and without significant wear on the membrane or on the positioning elements.

In a particularly preferred embodiment, the large-area flexible membrane can comprise an elastic film, which consists of a material that is resistant to the utilized immersion media or the utilized photoresists and which facilitates an extension. In this case, suitable materials are a polymer, in particular polyethylene (PE) or polyimide (PI), nylon (polyamide), or very thin, flexible glass films (ultra-thin glass), as described by, e.g., F. He et al., *Towards Flexible Glass: Ultra-Thin Glass with Tight Dimensional Tolerance and High Strength Achieved by Ion Exchange*, SID Symposium Digest of Technical Papers, 2017, page 48. The membrane holder can preferably be designed as a tension ring, using which an uncreased profile of the membrane can be achieved. Alternatively, an arrangement of rollers and/or sliding surfaces can be provided, in particular, for the automatic removal of contaminated regions of the membrane and for the supply of cleaner regions thereof.

In a preferred embodiment for the application of multi-photon lithography, the membrane can comprise a material that is transparent in the wavelength range of a short pulse laser used for lithographic processing but opaque in the wavelength range in relation to which the photosensitive material or the photoresist is sensitive as a consequence of linear (one photon) absorption. Hence, the membrane can offer protection against unwanted exposure of the photoresist by ambient light but allows processing by multi-photon polymerization using the short pulse laser. When the membrane is integrated into an object transport unit, this allows the object transport unit to be transported through regions in which no so-called yellow light is present, i.e., in which the UV components of the ambient light are not filtered. By way of example, a corresponding spectrally selective transmission of the membrane can be provided by the inherent material properties of the membrane, or else this can be achieved, for example, by the addition of corresponding materials or by suitable coatings, which have been for example deposited or applied in the liquid phase and which can at least partly reflect and/or at least partly absorb UV components of the light.

In a preferred embodiment, the membrane can be attached in laterally immobile fashion with respect to the object, whereas the axial mobility of the membrane or at least of the portion of the membrane penetrated by the light beam is not impaired. This embodiment is advantageous, in particular, if structures with lateral dimensions greater than a field of view or a writing field, which is addressable using a beam scanner, of the objective are intended to be lithographically produced or optically characterized, which requires a lateral movement of the objective relative to the object. A fixed lateral position of the membrane relative to the object prevents shearing forces from being introduced into the immersion medium in contact with the object or into the photoresist in the case of a lateral movement, which shearing forces could lead to relative movement of the object and the layers of the immersion medium adjacent to the object and hence lead to damage of structures on the object. Instead, the shearing forces can be introduced into the immersion medium situated between the membrane and the objective, said immersion medium not being in contact with the object and consequently being unable to cause damage to the object or to structures situated thereon. Moreover, the immersion medium can have a low viscosity in order to keep forces that act on the objective in the case of a lateral movement small. Alternatively, no immersion medium might be provided for the case where the objective is a dry objective. In this case, the membrane can contribute to creating a well-defined interface with optical quality, through which the light beam can be coupled into the immersion medium or the photoresist or can be output coupled therefrom, without disturbances. Advantageously, an assembly of the membrane which is immobile relative to the object in the lateral direction can preferably be achieved by virtue of the membrane holder being affixed to the object carrier or the object stage or being integrated in an object transport unit. The axial mobility of the portion of the membrane penetrated by the light beam can preferably be achieved here by an elastic deformability of the membrane itself or of the membrane holder.

In a particular embodiment, lithographic patterning in a solid photoresist can be undertaken using an air objective, the surface of which photoresist may have a pronounced topography and therefore cannot serve as a defined optical interface. The solid photoresist can be made of materials such as polymethyl methacrylate (PMMA), SU-8, ormocers or substances related to these materials. For further details in respect of the "SU-8" material, reference is made by way of example to the description in http://www.microchem.com/pdf/SU8_50-100.pdf (retrieved on Dec. 7, 2018). For this purpose, a first immersion liquid that has been matched to the photoresist in respect of the refractive index can be applied to the solid photoresist, said first immersion liquid being delimited in the direction of the objective by the membrane with a defined optical face such that the light used for lithographic patterning and emitted by the dry objective can be coupled into the solid photoresist with little disturbance—even for the case where the photoresist has a pronounced surface topography.

In a similar way, this arrangement can also be used to capture structures buried in the photoresist in imaging fashion with a high resolution. Alternatively, a further immersion liquid can be used between the membrane and the objective, it being possible for said further immersion liquid to have a refractive index and/or viscosity that deviates from the first immersion liquid and hence also deviates from the solid photoresist. For this case, the refractive index and/or the viscosity of the second immersion liquid and the position of the interface defined by the membrane can preferably be chosen in a manner that the beam path between the objective and the object has minimal geometric aberrations in order thereby to achieve the greatest possible spatial concentration of the optical power in the focal point.

For further details in relation to the proposed apparatus, reference can be made to the exemplary embodiments below.

In a further aspect, the present invention relates to a method for optically characterizing or for optically processing an object, which can be performed, in particular, using the apparatus for optically characterizing or processing an object, which is likewise described herein. The method comprises the steps a) to f) described in more detail below, wherein each individual step can also be carried out multiple times and at least successive steps can also be carried out at least partly simultaneously:

a) positioning at least one object on an object carrier;
b) applying an immersion medium to at least part of the object;
c) approaching a membrane to the part of the object covered with the immersion medium, wherein the membrane has a transparent portion provided for light to penetrate;
d) positioning an objective, which defines an optical axis, relative to the part of the object covered by the immersion medium;
e) setting an axial position for the portion of the membrane with respect to the optical axis; and
f) optically characterizing or processing the object using the light.

According to step a), at least one object is initially applied to an object carrier. As described above or below, the object can be an individual object or an object comprising a plurality of partial objects.

According to step b), an immersion medium is applied to a portion of the object to be optically characterized or processed. This can be carried out manually or using a technical apparatus, in particular a dispensing unit. In this case, the dispensing unit can be situated directly in the optical characterization or processing unit or can be provided in the form of an autonomous device, from which the object provided with the immersion liquid can be transferred into the optical characterization or processing unit. The immersion medium can be a photoresist.

According to step c), a membrane approaches the part of the object covered with the immersion medium. To this end, the membrane can be fastened to a membrane holder in particular. In this case, the membrane has a portion that is transparent to the light used for characterizing or processing the object and serves to delimit, in the direction of the objective, the immersion liquid that is in contact with the object. The portion of the membrane penetrated by the light is designed to be movable relative to the object in the axial direction. As described further, both the membrane and the membrane holder are fastened at a point outside of the objective in this case such that neither the membrane nor the membrane holder is fastened to the objective itself. Further, first contact points between the membrane and the membrane holder are located on or outside of a lateral surface which is formed by a geometric extrusion of the edge of the end face of the objective parallel to the optical axis. Depending on the embodiment, the approach of the membrane to the portion of the object covered by the immersion liquid can be implemented either in the optical characterization or processing unit itself, in a dispenser unit suitable for the application of the photoresist, or in a further functional unit suitable for applying the membrane. When transferring the object provided with the immersion liquid into the optical characterization or processing unit, the membrane, in conjunction with an appropriately designed object transport unit, can consequently adopt the protective function, described above and below, for avoiding contamination or contact with oxygen or moisture in the air.

According to step d), an objective, which defines an optical axis in the present optical system, is positioned relative to the part of the object covered by the immersion medium.

According to step e), an axial position is set as advantageously as possible for the portion of the membrane, the term "axial" relating to the optical axis defined by the objective. To this end, use can be made, in particular, of positioning elements as described above or below. In this context, the membrane is positioned in the work space of the objective and the portion of the axially movable membrane penetrated by the light is brought into a desired axial position between the objective and the object. In a particular embodiment, the axial positioning of the portion of the membrane penetrated by the light beam can be performed together with the positioning of the objective relative to the object in a synchronized movement caused by the same actuator, wherein the axial approach of the membrane to the part of the object covered by the immersion liquid, to be carried out according to step c), can additionally be implemented at the same time. To this end, the membrane and the membrane holder can preferably be attached to the objective stage and can be brought to the object together with the objective.

Finally, the optical characterization or processing of the object using the light beam is implemented according to step f).

In a preferred embodiment of the present method, steps a) to c) can be performed in a dispenser unit which is configured to apply the immersion medium used between the membrane and the object. Following this, an object transport unit, which comprises at least the object carrier in addition to the membrane and the membrane holder or which is configured as an object carrier, can be transferred to an optical characterization or processing unit. Thereupon, steps d) to f) can be carried out in the optical characterization or processing unit, which is also referred to as "lithography unit" below. In this way, the automated application of the immersion medium on the object, the transfer of the object provided with the immersion medium, and the optical characterization or processing can be implemented within a production chain in separate functional units that have a specific embodiment for the respective function. As a result, this advantageously in this case renders possible an application of a liquid photoresist in a separate functional unit and a subsequent transfer within a production chain, in particular for the transport between different functional units, using the membrane as part of a container surrounding the object. For the transport between the functional units in particular, it may be particularly advantageous if the membrane is transparent to light at the wavelength used for the processing and/or characterization but not transparent at shorter wavelengths such that, as described above, it is not possible to trigger any unwanted polymerization of the photoresist by ambient light, particularly when use is made of multi-photon lithography.

According to a further aspect, the present invention relates to an object transport unit, comprising an object carrier for receiving an object, at least one membrane introduced between an objective and the object carrier, wherein the membrane has a portion configured for penetration by light, wherein at least the portion of the membrane is movable in the axial direction with respect to the optical axis, and at least one membrane holder for holding the at least one membrane, wherein the object transport unit is at least transferable between a handling unit for immersion media and an apparatus for optically characterizing or processing an object, in particular an apparatus for optically characterizing or processing an object as described herein, wherein the handling unit is at least configured to apply an immersion medium used between the membrane and an object to be characterized or processed, and wherein the optical characterization or processing unit comprises at least one device for producing or for receiving the light and the objective for exposing the object using the light or for capturing the light from the object.

In this case, the term "handling unit" denotes a device configured to provide, store, transport, and output at least one immersion medium. To this end, the handling unit can comprise, in particular, a dispensing unit, using which the immersion medium is applied to the object. Further, the handling unit can be configured to surround the object provided with an immersion medium with the object transport unit, which is designed preferably in liquid-tight fashion, in particular as a closed container. The object or the object transport unit can preferably be transported from the handling unit to the optical characterization or processing unit using a conveyor system under normal ambient conditions. The term "normal ambient conditions" means that the crossed spatial area has no requirements in respect of cleanliness, in particular no cleanroom class, in respect of exposure, in particular no yellow light surroundings, in respect of atmospheric boundary conditions, in particular no regulated humidity, and/or in respect of electrostatic discharge, in particular no protection against electrostatic discharge (ESD).

In respect of further details in relation to the present method and the object transport unit, reference can be made to the description of the apparatus and to the exemplary embodiments.

The present apparatus, the present method, and the object transport unit have a number of advantageous differences in relation to US 2005/0158673 A1, which discloses an apparatus for 2D immersion lithography, in which the immersion liquid is encapsulated in a balloon formed from a thin membrane. There, the balloon filled with immersion liquid is positioned between the objective and the object in a manner that it is in contact with both the objective and the object. As a result, an immersion objective can be used for high resolution 2D lithography and can be protected from contamination. However, a transfer of this disclosure to direct writing 3D lithography would be linked to far-reaching curtailments. The use of a liquid photoresist is eliminated since the latter would be displaced from the object by the pressure of the liquid-filled balloon and, even in the case of a solid photoresist, the application is restricted to cases where the photoresist has a very plane surface of optical quality such that a disturbance-free transition of light is possible from the balloon to the photoresist. As a result, the height of the producible structures is inherently restricted. Further, the filled balloon leads to forces being exerted on the objective which make fast and precise relative positioning between the object and the objective more difficult and therefore can lead to a restriction in the precision and/or the write speed. Moreover, this cannot be used to compensate for aberrations when patterning at different depths.

Furthermore, the present apparatus, the present method and the object transport unit have advantageous differences in relation to U.S. Pat. No. 7,570,343 B2. U.S. Pat. No. 7,570,343 B2 discloses an apparatus and a method for projection lithography, in which 2D structures are produced on substantially planar objects, which typically have a maximum unevenness of the order of one or a few light wavelengths of the lithography radiation. There, the introduction of a projection light-transmissive termination element in the object-side light path of the system is proposed, the termination element also being able to serve for separating two immersion liquids. The termination element can either be a solid plate with a macroscopic thickness or a thin membrane, wherein the position of the termination element between the object and the projection objective can be set by appropriate adjustment elements when setting up the system. Only micrometer screws which can be situated in an interstice between an end face of the objective and the object are mentioned as adjustment elements. Alternatively, the position of the membrane can be moved by way of the hydrostatic pressure of the adjoining immersion liquids. Further, by way of a suitable geometric design, the termination element can serve to correct aberrations of the lithography device. In the case of a flexible membrane, the geometric design can also be achieved by varying the hydrostatic pressure of the immersion liquids adjoining on both sides. However, no axial relative movement between the objective and the object during the writing procedure is provided therein, which movement is required during optical 3D processing and characterization in order to construct or capture a 3D structure layer-by-layer in the direction of the optical axis. Hence, it is sufficient in that case to set the axial position of the termination element between the objective and the object once when setting up the lithography device, preferably in manual fashion using micrometer screws; a change of this position during the writing procedure as a result of displacing the termination element in the axial direction with respect to the optical axis defined by the objective is not desired, while it is mandatory for direct writing 3D lithography. As a result, use can be made of large objectives with a large working distance and nevertheless a high NA, which objectives have a large mass and could therefore only be moved quickly and precisely in the axial direction with difficulty within the scope of direct writing 3D lithography. Since in that case neither the objects nor the substrates or the structures produced thereon by lithography have a three-dimensional topography, it is possible in that case to operate the lithography device with a very small safety margin between the transparent termination element and the object, i.e., it is possible in that case to reduce the distance between the termination element and the surface of the planar substrate that has been coated with a solid photoresist to a very small value that is just sufficient to avoid mechanical collisions. As a result of the very large working distance of the objective and the very small safety margin required for 2D lithographic patterning, it is possible in that case to introduce comparatively large optical and/or mechanical assemblies into the spatial region between the end face of the objective and the object, said assemblies possibly reducing the usable working distance of the arrangement to a fraction of the nominal working distance of the objective. A variation in the hydrostatic pressure of the immersion liquid on at least one side of the membrane is described therein as a further option for positioning a transparent termination element that is designed as a thin membrane. However, an application of this option to 3D direct writing lithography methods would be connected with significant restrictions: Firstly, it would be necessary to this end to seal the volume of the immersion liquid in a manner that a controlled pressure could be built up and maintained, which is very complicated and could only be realized with difficulty in an industrial manufacturing process with short cycle times. Furthermore, the pressure change in the flexible membrane would lead to a change not only in the position thereof but also in the curvature thereof, and so position and refractive power of the membrane could disadvantageously not be set independently of one another by way of a variation in the pressure. Further, setting the pressure requires storage of a relatively large volume of immersion liquid for equalizing purposes; this is disadvantageous in respect of a minimization of the volume of photoresist in the case where a photoresist serves as an immersion liquid. In that case, a solid, thin layer applied to the object serves as a photoresist, the maximum thickness of which is of the order of one or a few light wavelengths of the lithography radiation, which would therefore not suffice for the production of functional 3D structures. The use of a liquid photoresist as an immersion medium is not provided in that case. Accordingly, there is no risk in that case either of an unwanted polymerization of the liquid photoresist occurring on the exit window of the objective or of damage possibly occurring on the object or on structures produced thereon on account of relative movement between the object and the layers of the liquid immersion medium adjoining the object.

BRIEF DESCRIPTION OF THE FIGURES

Further details and features of the present invention are apparent from the following description of preferred exemplary embodiments, in particular in connection with the dependent claims. Here, the respective features can be implemented by themselves, or a plurality thereof can be implemented together in combination. The invention is not limited to the exemplary embodiments.

The exemplary embodiments are illustrated schematically in the following figures. Identical reference numerals in the figures refer to identical or functionally identical elements or to elements which correspond to one another in terms of their functions.

Figure 1:
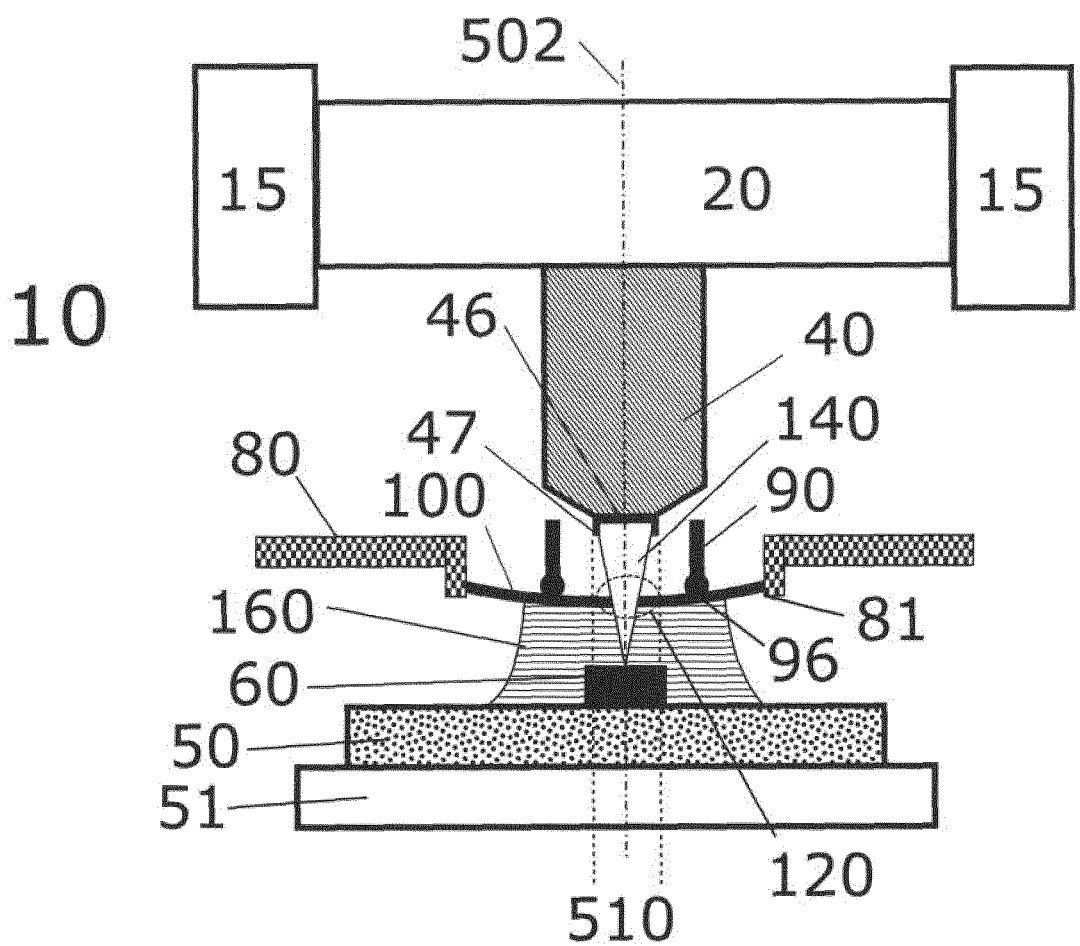
Figure 2:
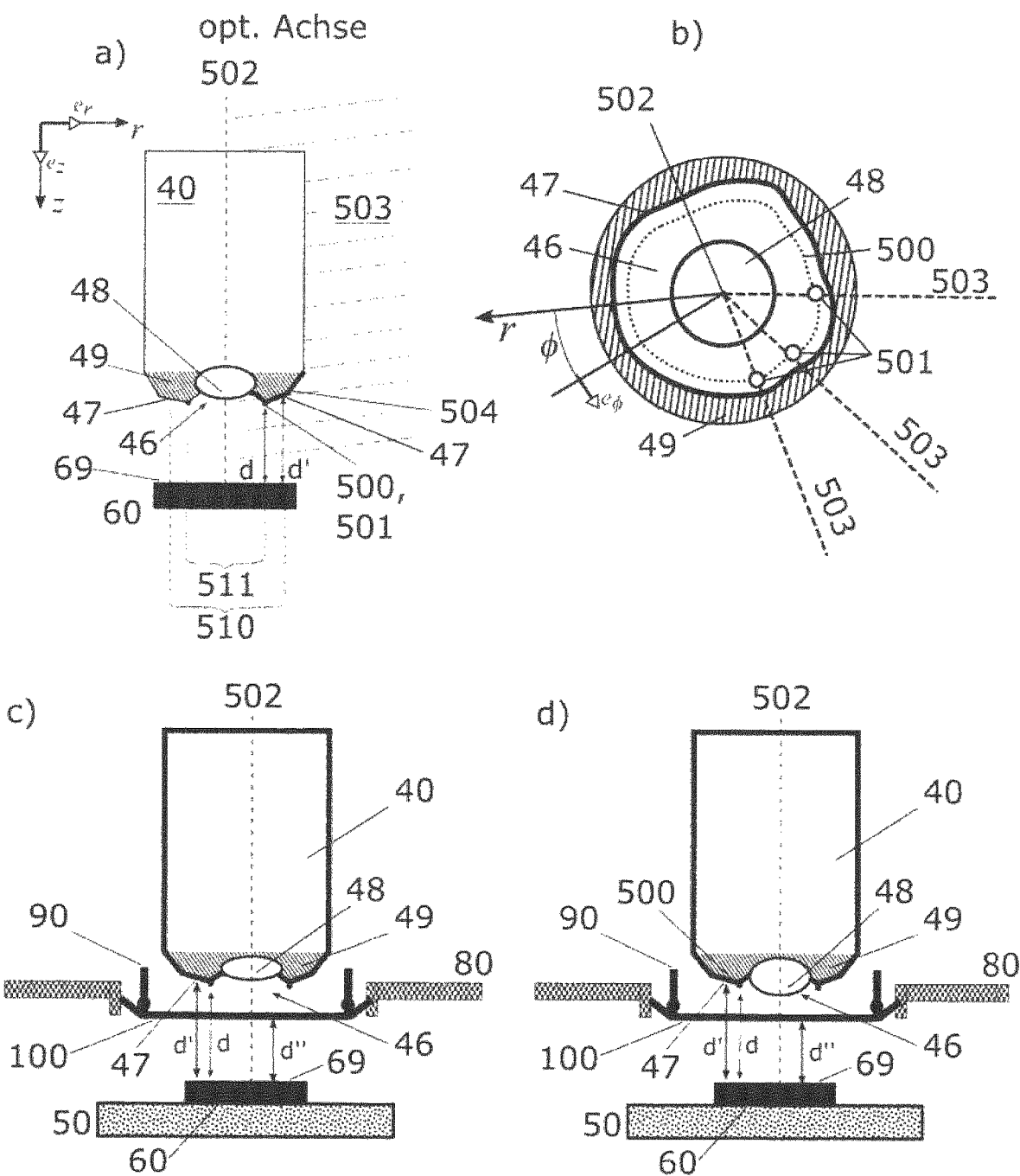
Figure 3:
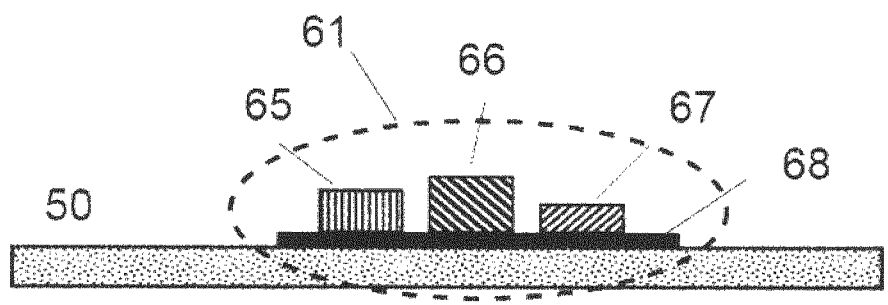
Figure 4:
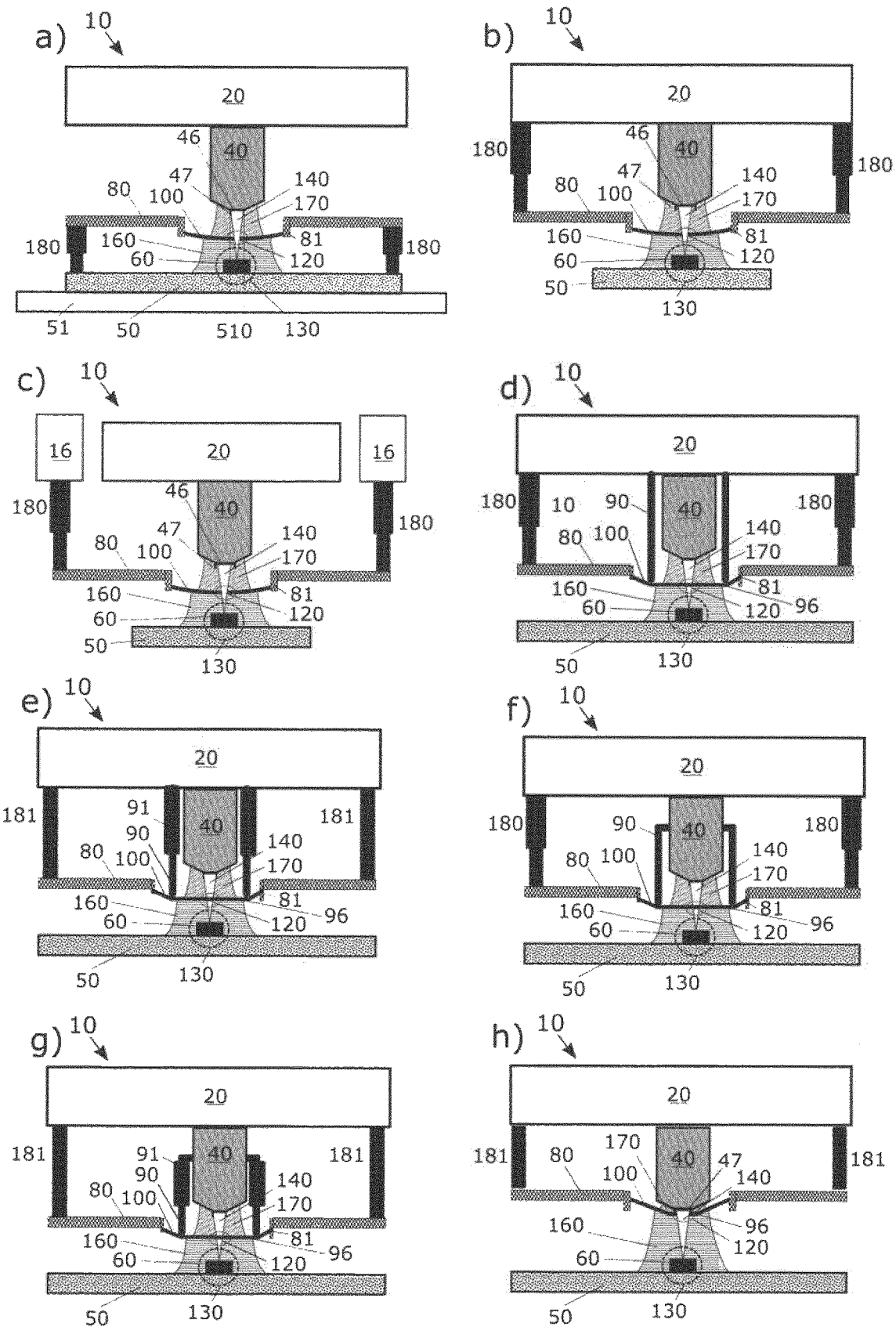
Figure 4:
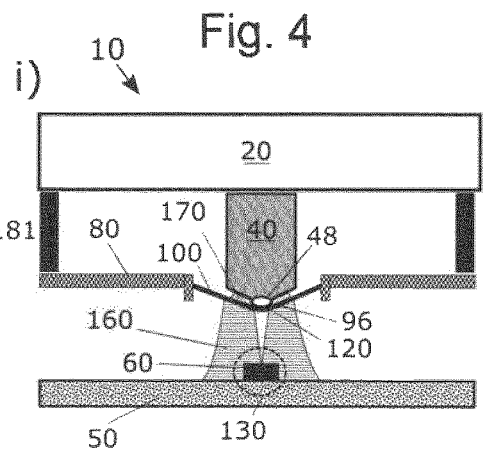
Figure 4:
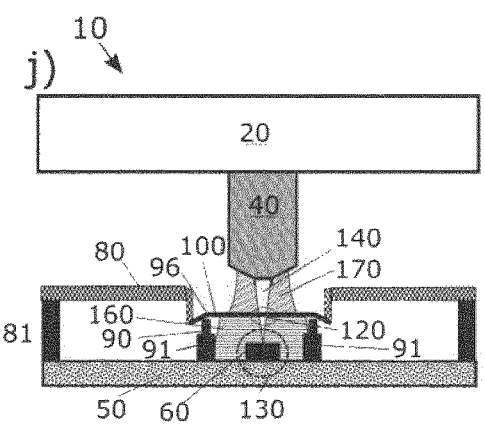
Figure 4:
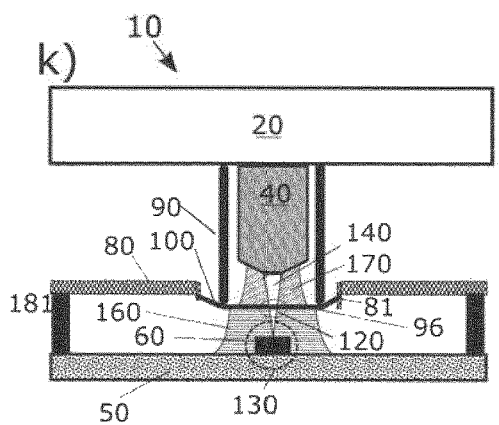
Figure 4:
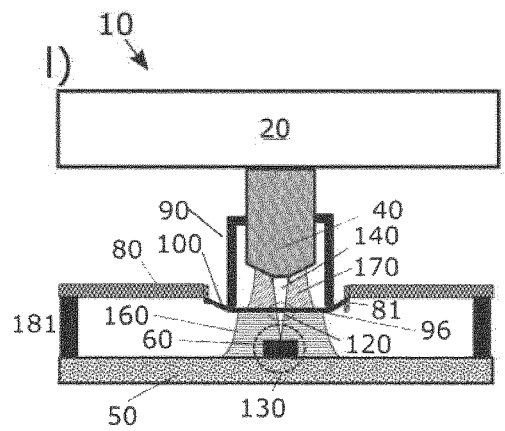
Figure 4:
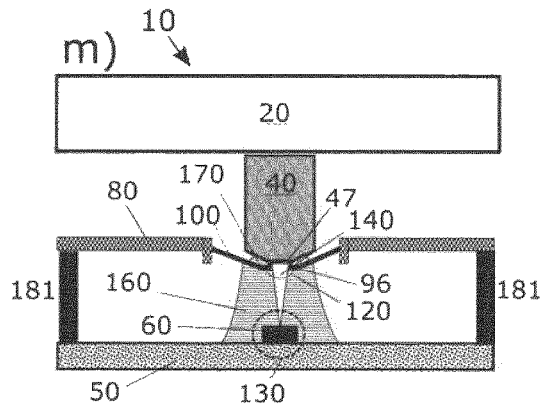
Figure 4:
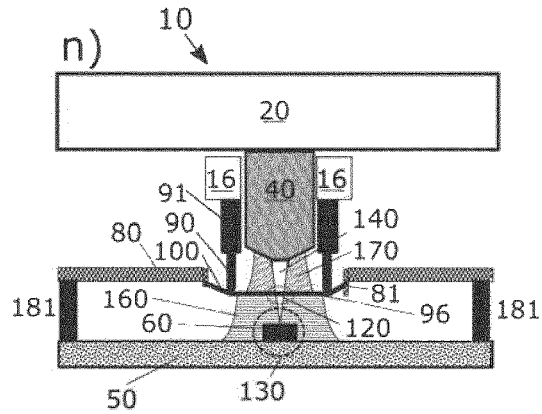
Figure 4:
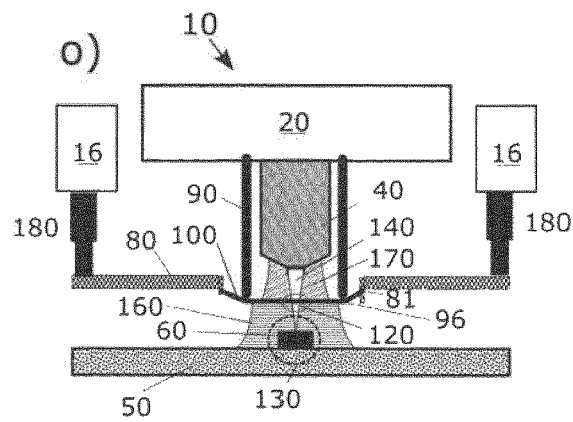
Figure 4:
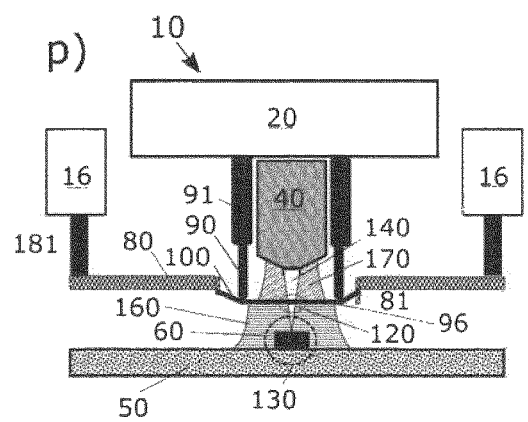
Figure 5:
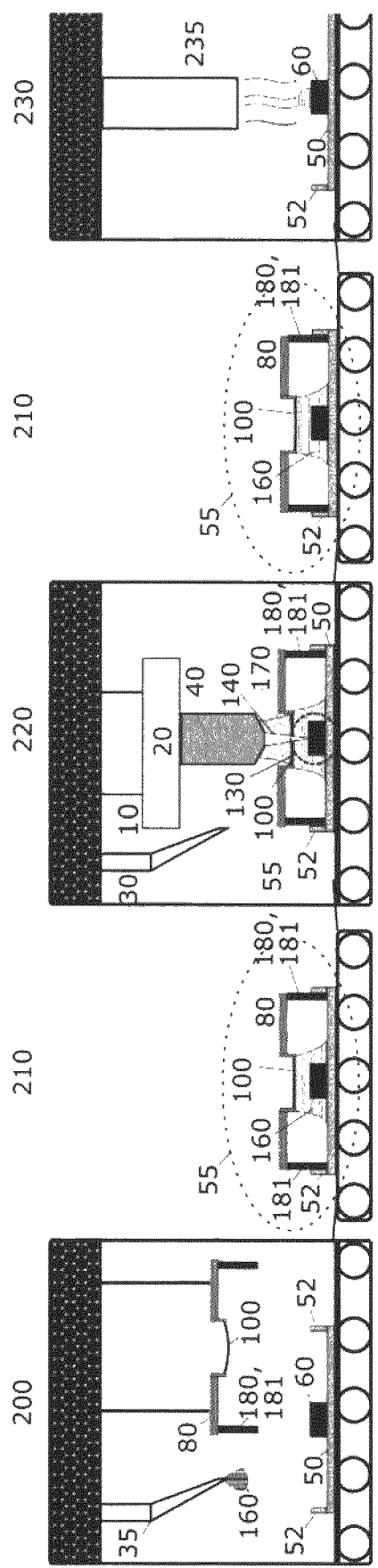
Figure 6:
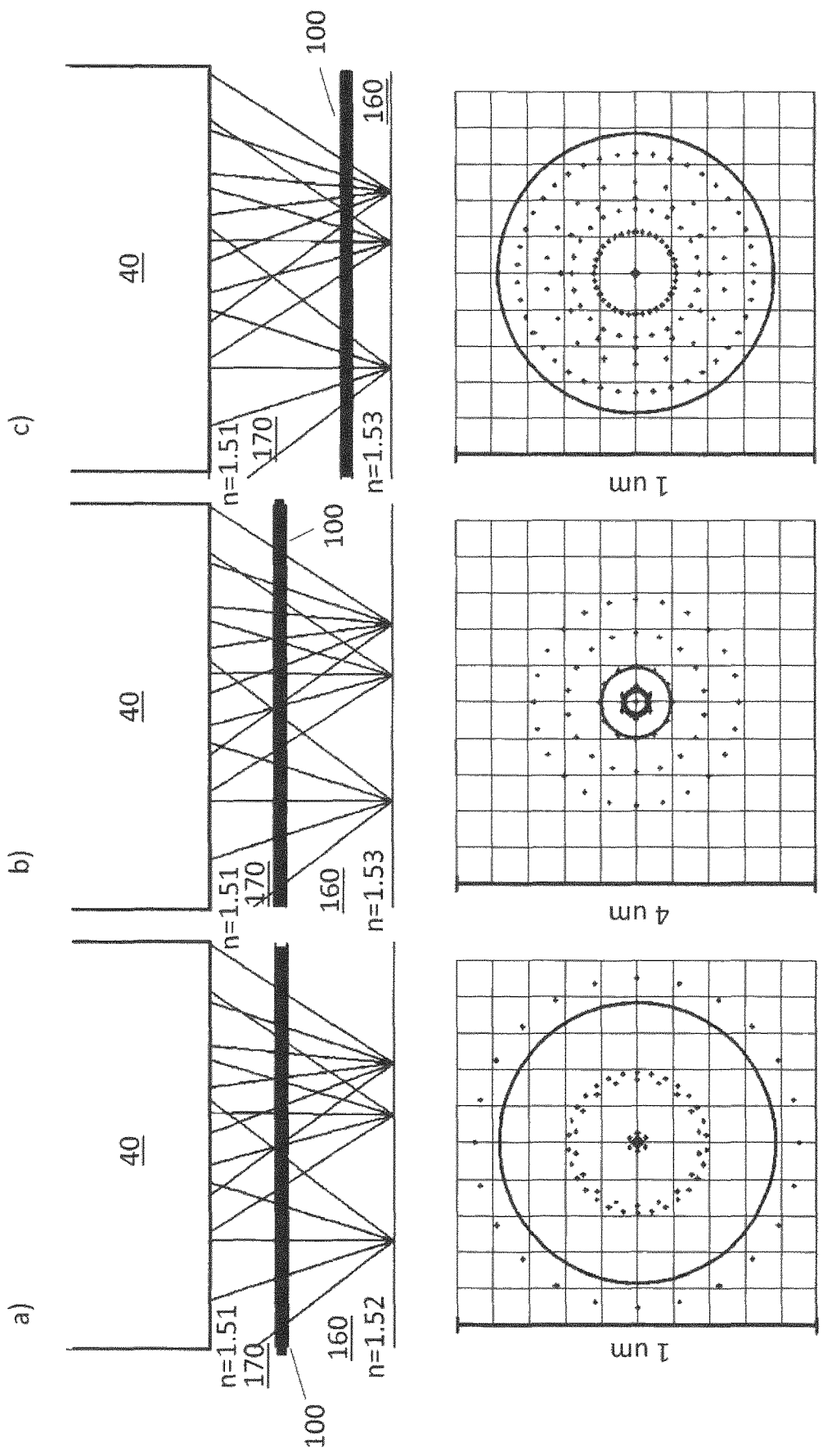
Figure 7:
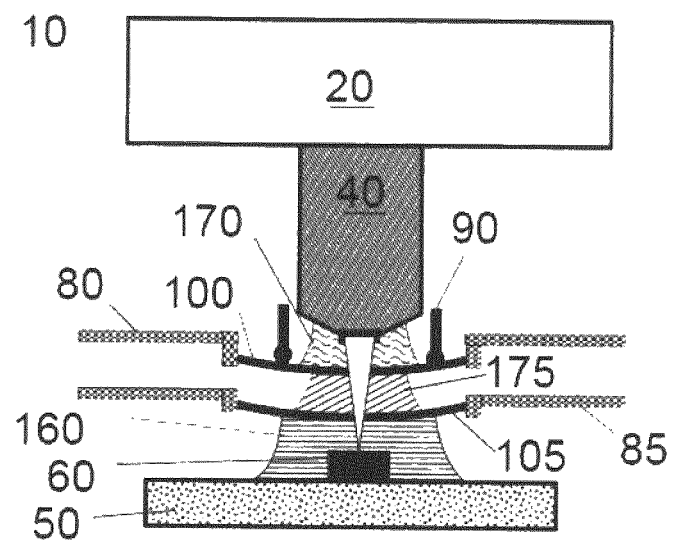
Figure 8:
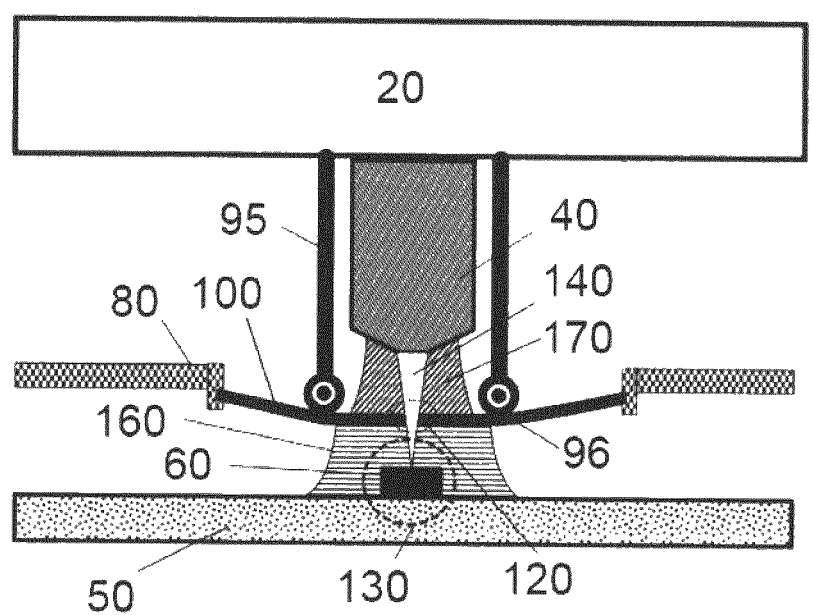
Figure 12:
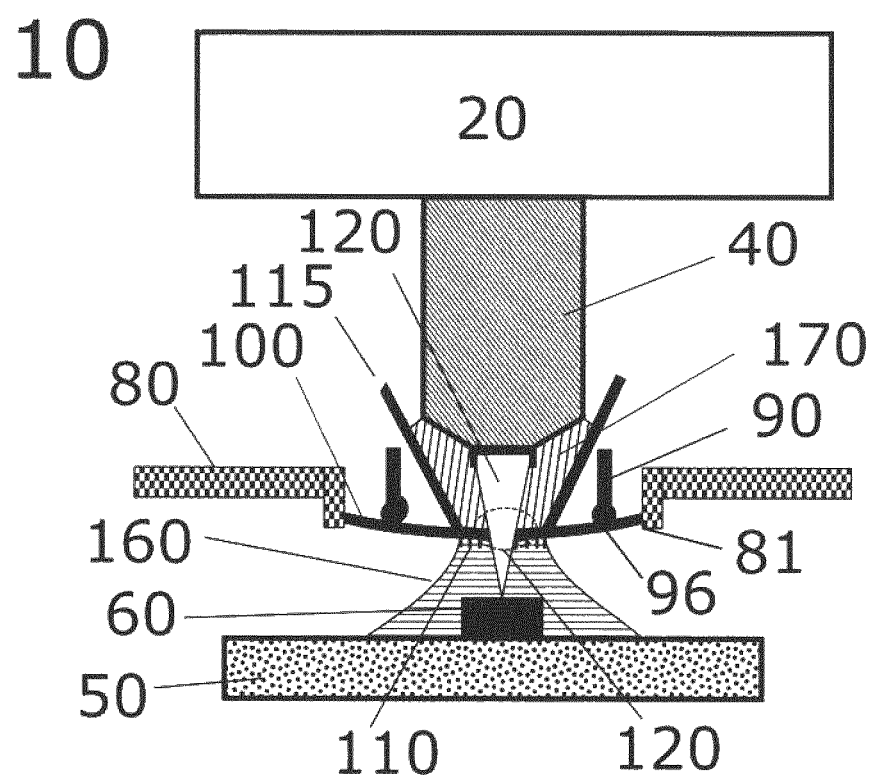
Figure 13:
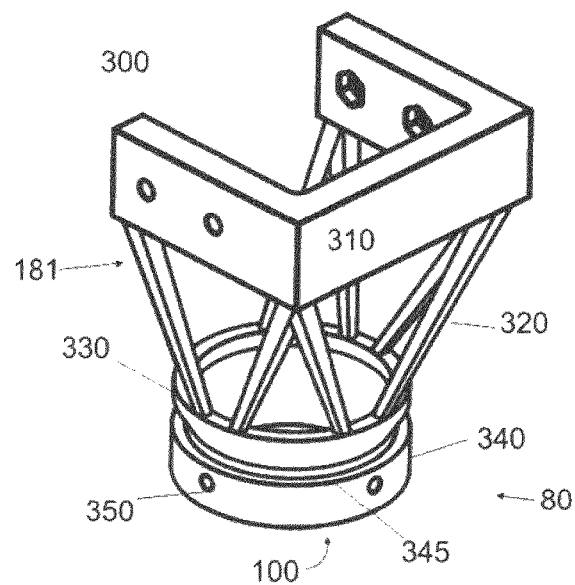
Figure 14:
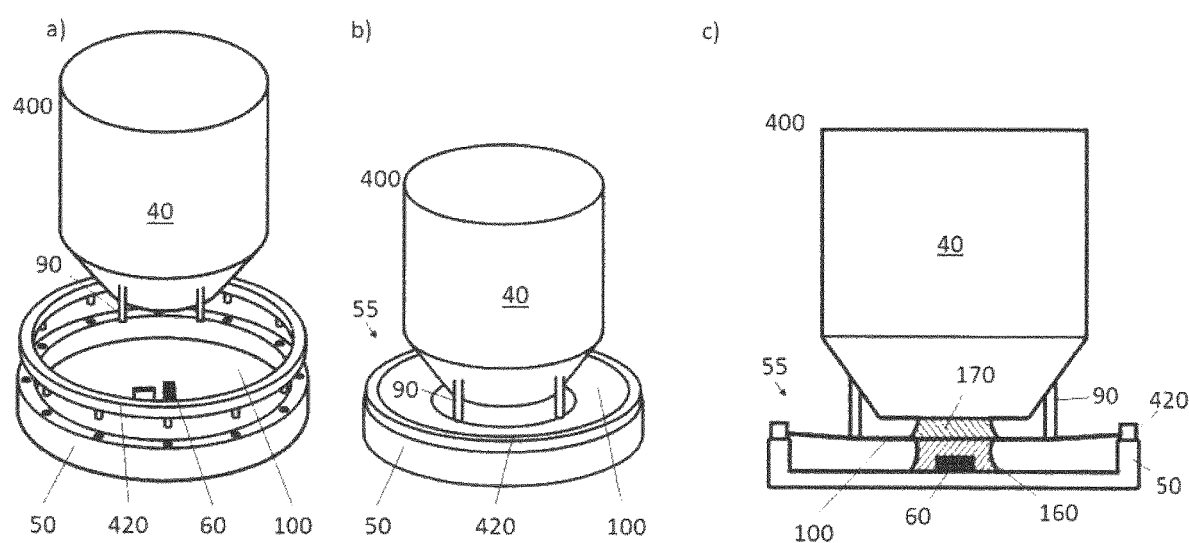

Specifically:

FIG. 1 shows a schematic illustration of a preferred exemplary embodiment of the apparatus according to the invention;

FIG. 2 shows a schematic illustration of particularly preferred exemplary embodiments of an objective for the apparatus according to the invention;

FIG. 3 shows a schematic illustration of an object which comprises a plurality of partial objects;

FIG. 4 shows a schematic illustration of a plurality of exemplary embodiments for membrane holder and positioning elements;

FIG. 5 shows a schematic illustration of a device comprising a plurality of apparatuses with separate functions, and an object transport unit;

FIG. 6 shows results of a simulation of the imaging quality of the apparatus according to the invention;

FIG. 7 shows a schematic illustration of a further, preferred exemplary embodiment of the apparatus according to the invention which comprises a second membrane;

FIG. 8 shows a schematic illustration of a further, preferred exemplary embodiment of the apparatus according to the invention, in which forces for the deformation and axial positioning of the membrane or of its transparent portion are introduced by a positioning element that is fastened to the objective stage or to the objective;

FIG. 9 shows a schematic illustration of a further, preferred exemplary embodiment of the apparatus according to the invention, in which the membrane holder is fastened to the objective stage;

FIG. 10 shows a schematic illustration of a further, preferred exemplary embodiment of the apparatus according to the invention, in which the membrane holder is likewise connected to the objective stage;

FIG. 11 shows a schematic illustration of a further, preferred exemplary embodiment of the apparatus according to the invention, comprising a solid photoresist which covers the object;

FIG. 12 shows a schematic illustration of a further, preferred exemplary embodiment of the apparatus according to the invention, in which the membrane has lateral structuring;

FIG. 13 shows a schematic illustration of a preferred exemplary embodiment of an arrangement for membrane holder and positioning; and FIG. 14 shows a schematic illustration of a further, preferred exemplary embodiment of the apparatus according to the invention and the object transport unit, prior to an assembly in a plan view (FIG. 14a) and after the assembly in a plan view (FIG. 14b) and as a cross section (FIG. 14c).

DESCRIPTION OF THE EXEMPLARY EMBODIMENTS

FIG. 1 shows a schematic illustration of a preferred exemplary embodiment of the apparatus 10 according to the invention for optically characterizing or processing an object 60. The apparatus 10, illustrated in exemplary fashion in FIG. 1, comprises an object carrier 50 for receiving the object 60, an optical characterization or processing unit 15, which comprises a device for producing light, which is provided in this case in exemplary fashion in the form of at least one light beam 140 and which can therefore also be referred to as a "lithography unit", and an objective 40 for exposing the object 60 using the light beam 140, a membrane 100 introduced between the objective 40 and the object 60, a membrane holder 80 for holding the membrane 100, and an immersion medium 160 which is introduced between the membrane 100 and the object 60. The membrane 100 comprises a portion 120 which is configured to be penetrated by the light beam 140 used for imaging or processing, wherein at least the portion 120 of the membrane 100 is arranged movably in the axial direction in relation to an optical axis 502, which is defined by the objective 40. To this end, at least one positioning element 90 can preferably be used to be able to move the portion 120 of the membrane 100 in the axial direction during the characterization or processing procedure. The objective 40 has an end face 46 which faces the object carrier 50, the end face 46 having an edge 47.

According to the invention, it is proposed to attach the membrane 100 to the membrane holder 80 in a manner that first contact points 81 between the membrane 100 and the membrane holder 80 are located on or outside a lateral surface 510 which is formed by a geometric extrusion of the edge 47 of the end face 46 of the objective 40 parallel to the optical axis 502. In this case, the geometric extrusion of the edge 47 of the end face 46 of the objective 40 parallel to the optical axis 502 in this case denotes an increase in the dimensionality of the edge 47 of the end face 46 of the objective 40 by way of a parallel displacement in space, parallel to the optical axis 502. In this way, the edge 47 of the end face 46 of the objective 40, which represents a line or a curve, is drawn in a manner along a direction parallel to the optical axis 502 that the desired lateral surface 510 is obtained by this process. Consequently, the lateral surface 510 describes the surface formed by the geometric extrusion of the edge 47 of the end face 46 of the objective 40 parallel to the optical axis 502. This lateral surface 510 can also be understood to be an enveloping surface of a cylindrical body which arises from a geometric extrusion of the end face 46 along the optical axis 502 and which, depending on a profile of the edge 47, can adopt any cross section, in particular in the form of a circle, an ellipse, or an oval. However, other shapes of the cross section are possible. This embodiment according to the invention of the present apparatus 10 consequently renders it possible to use the installation space available in the axial direction on or outside of the lateral surface 510 for the purposes of configuring the membrane holder 80, advantageously without in the process curtailing the usable working distance of the apparatus 10 by way of mechanical elements which, according to the prior art, would be introduced between the end face 46 of the objective 40 and the object 60.

FIG. 2 shows a schematic illustration of particularly preferred exemplary embodiments of the objective 40, which is provided for use in the apparatus 10 according to the invention.

Herein, FIG. 2a shows a cross section through the objective 40, said cross section showing the end face 46, the edge 47 of the end face 46, an exit window 48, and a mount 49 of the objective 40. In this case, the part of the mount 49 of the objective 40 facing the object 60 forms a ridgeline 500, which defines a contour surrounding the optical axis 502, which contour is formed by the points protruding furthest in the direction of the object 60 parallel to the optical axis 502. Preferably, the ridgeline 500 of the mount 49 of the objective 40 can be constructed as follows: Initially, intersections of the mount 49 with a manifold of half-planes 503, which start at the optical axis 502 and extend in the radial direction, are determined. In this case, the term "radial" is understood to be a direction that is perpendicular to the optical axis 502 and which is denoted in FIG. 2b by the coordinate r or the local unit vector $e_r$; the axial direction extends parallel to the optical axis 502 and is denoted by the coordinate z and the local unit vector $e_z$. The term "azimuthal", the associated parameter φ and the associated local unit vector $e_φ$ are used in accordance with the known definitions of polar coordinates in order to denote a direction oriented locally perpendicular to the radial and the azimuthal axes, wherein the direction emerges from the right hand property of the coordinate system ($e_r$, $e_φ$, $e_z$). Combinations of radial and azimuthal directions are also referred to as "lateral" directions. Each of the intersections of the mount 49 with a half-plane 503 has a contour 504, from which the ridge point 501 belonging to the respective radial direction can be ascertained. For this purpose, the point 501 of the contour 504 which is closest to the surface 69 of the object 60 is determined under the assumption of an object 60 with a plane surface 69 that is perpendicular to the optical axis 502. Finally, the ridgeline 500 is formed by a set of the ridge points 501 belonging to the various radial directions. Moreover, the term end face 46 can be defined using the ridgeline 500 of the mount: The end face 46 at least comprises the exit window 48 of the objective 40. In the case of a mount 49 adjoining this exit window 48, the end face 46 additionally comprises the region of the mount 49 enclosed by the ridgeline 500 and all points outside of the ridgeline 500 which, in the case of a plane surface 69 of the object 60 aligned perpendicular to the optical axis 502, have a distance d' from the object which is preferably greater than the maximum distance d of a point on the ridgeline 500 from the surface 69 of the object 60 by less than 5 mm, particularly preferably by less than 1 mm, in particular by less than 300 μm. In this case, the end face 46 of the objective 40 forms a simple contiguous area, which is delimited by the edge 47. According to this definition, the points of the end face 46 closest to the object 60 are therefore not necessarily located on the ridgeline 500 of the mount 49. A corresponding case is sketched out in FIG. 2d. FIG. 2d shows a schematic illustration of a particularly preferred exemplary embodiment of the apparatus 10, in which the objective 40 has a convexly curved exit window 48, while the exit window 48 is plane in FIGS. 2a to 2c. In the case of the convexly curved exit window 48 of the objective 40, the points closest to the object 60 can be located on the exit window 48 itself. However, the above-described definition of the end face 46 of the objective 48 remains untouched by this embodiment.

FIG. 2b illustrates a plan view of the end face 46 of the objective 40 parallel to the optical axis 502. In this case, the ridgeline 500, the end face 46, the edge 47, the exit window 48, and the mount 49 of the objective 40 are evident.

FIG. 2c shows a schematic illustration of a particularly preferred exemplary embodiment of the apparatus 10, which comprises the objective 40 from FIGS. 2a and 2b. In this case, a working distance d between the exit face 48 of the objective 40 and the surface of the object 60 is partitioned by the membrane 100 into a usable working distance d" between the side of the membrane 100 facing the object 60 and the object 60.

FIG. 3 shows a schematic illustration of an object in the form of a multi-chip module 61, which comprises a plurality of partial objects 65, 66, 67, wherein the partial objects 65, 66, 67 are attached to a common base plate 68 and wherein, as illustrated in FIG. 3, the base plate 68 can be placed on the object carrier 50. Alternatively, the base plate 68 itself can form the object carrier 50 (not illustrated).

FIG. 4 shows a schematic illustration of a multiplicity of exemplary embodiments for the membrane holder 80 and the positioning elements 90. Moreover, further exemplary embodiments according to the invention which comprise further possible combinations of membrane holders 80, membrane fastening means, and positioning elements 90 are conceivable.

In the embodiment of FIG. 4a, the membrane holder 80 is fastened to the object carrier 50. In this case, the membrane holder 80 can be movably mounted by way of an actuator 180, in a manner that the membrane holder 80 can simultaneously serve as the positioning element 90 in this embodiment, the portion 120 of the membrane 100 penetrated by the light beam 140 being able to be moved axially therewith. In an alternative embodiment, the membrane holder 80 can be fastened to the object stage 51.

In the embodiment of FIG. 4b, the membrane holder 80 is fastened to the objective stage 20. In this case, the membrane holder 80 can be movably mounted by way of an actuator 180, in a manner that the membrane holder 80 can simultaneously serve as the positioning element 90 in this embodiment, in order to be able to axially move the portion 120 of the membrane 100 penetrated by the light beam 140.

In the embodiment of FIG. 4c, the membrane holder 80 is fastened to a further part of the lithography device 16. In this case, the membrane holder 80 can be movably mounted by way of an actuator 180, in a manner that the membrane holder 80 can simultaneously serve as the positioning element 90 in this embodiment, the portion 120 of the membrane 100 penetrated by the light beam 140 being able to be moved axially therewith. In contrast to the objective 40, the further part of the lithography device 16 is not a constituent part of the optical beam path and is therefore subject to lesser requirements in respect of precision and dynamics of the positioning than, for example, the objective, wherein the further part of the lithography device 16 used for fastening purposes can absorb at least some of the forces acting on the membrane 100.

In the embodiment of FIG. 4d), the membrane holder 80 is fastened to the objective stage 20. The positioning elements 90 are likewise fastened to the objective stage 20 and consequently allow the portion 120 of the membrane 100 penetrated by the light to be moved axially in a synchronous fashion with the movement of the objective stage 20. In this case, the membrane holder 80 can preferably be fastened to the objective stage 20 using actuators 180 and/or by one or more rigid fastening elements.

In the embodiment of FIG. 4e), the membrane holder 80 is fastened to the objective stage 20 using one or more fastening elements 181. The positioning elements 90 are likewise fastened to the objective stage 20 using actuators 91, with the aid of which the portion 120 of the membrane 100 penetrated by the light can be moved axially.

In the embodiment of FIG. 4f), the membrane holder 80 is fastened to the objective stage 20. The positioning elements 90 are fastened to the objective 40 and allow the portion 120 of the membrane 100 penetrated by the light to be moved axially in a synchronous fashion with the movement of the objective 40. In this case, the membrane holder 80 can preferably be fastened to the objective stage 20 using actuators 180 and/or by one or more rigid fastening elements.

In the embodiment of FIG. 4g), the membrane holder 80 is fastened to the objective stage 20 using one or more fastening elements 181. The positioning elements 90 are fastened to the objective 40 using additional actuators 91 and can, by way of the actuators 91, axially move the portion 120 of the membrane 100 penetrated by the light in relation to the objective 40.

In the embodiment of FIG. 4h), the membrane holder 80 is fastened to the objective stage 20 using one or more fastening elements 181. In this case, the objective 40 or a part of the objective 40, which can axially move the portion 120 of the membrane 100 penetrated by the light, serves as a positioning element 90. Second contact points 96 between the membrane 100 and the objective 40 can be formed by the edge 47 of the end face 46 of the objective 40, by the ridgeline 500 of the end face 46 of the objective 40, or by further constituent parts of the objective 40.

In the embodiment of FIG. 4i), the membrane holder 80 is fastened to the objective stage 20 using one or more fastening elements 181. In this case, the objective 40 or a part of the objective 40 serves as a positioning element 90 for axially moving the portion 120 of the membrane 100 penetrated by the light. If the objective 40 has a plane exit window 48 or an exit window 48 that is convexly arched in the direction of the object 60, the exit window 48 can have a shorter distance from the object 60 than the mount 49 of the objective 40; this also emerges from FIG. 2d. In the case of a flexible membrane 100, the latter can cling to the exit window 48 in the process.

In the embodiment of FIG. 4j), the membrane holder 80 is fastened to the object carrier 50 using one or more fastening elements 181. The positioning elements 90 are likewise fastened to the object carrier 50 using distinct actuators 91 and can, by way of these actuators 91, axially move the portion 120 of the membrane 100 penetrated by the light.

In the embodiment of FIG. 4k), the membrane holder 80 is fastened to the object carrier 50 using one or more fastening elements 181. The positioning elements 90 are fastened to the objective stage 20 and allow the portion 120 of the membrane 100 penetrated by the light to be moved axially in a synchronous fashion with the movement of the objective stage 20. In a manner analogous to this embodiment, further embodiments that are similar to the embodiment of FIG. 4e) are conceivable, in which the positioning elements 90 are fastened to the objective stage 20 using distinct actuators 91.

In the embodiment of FIG. 4l), the membrane holder 80 is fastened to the object carrier 50 using one or more fastening elements 181. The positioning elements 90 are fastened to the objective 40 and allow the portion 120 of the membrane 100 penetrated by the light to be moved axially in a synchronous fashion with the movement of the objective 40. In a manner analogous to this embodiment, further embodiments that are similar to the embodiment of FIG. 4g) are conceivable, in which the positioning elements 90 are fastened to the objective 40 by means is dedicated actuators 91.

In the embodiment of FIG. 4m), the membrane holder 80 is fastened to the object carrier 50 using one or more fastening elements 181. In this case, the objective 40 or a part of the objective 40, which can axially move the portion 120 of the membrane 100 penetrated by the light, serves as a positioning element 90. The contact points 96 between the membrane 100 and the objective 40 are formed by the edge 47 of the end face 46 of the objective 40, by the ridgeline 500 of the end face 46 of the objective 40, or by another constituent part of the objective 40. In a manner analogous to the embodiment of FIG. 4i), the exit window 48 can have a shorter distance from the object 60 than the mount 49 of the objective 40. In the case of a flexible membrane 100, the latter can cling to the exit window 48 in this case, too.

In the embodiment of FIG. 4n), the membrane holder 80 is fastened to the object carrier 50 using one or more fastening elements 181. The positioning elements 90 are fastened to a further part of the lithography device 16 using actuators 91 and can, with the actuators 91, axially move the portion 120 of the membrane 100 penetrated by light. In a manner analogous to this embodiment, embodiments in which the membrane holder 80 can be fastened to the objective stage 20, to the object stage 51, or to a further part of the lithography device 16 are also conceivable.

In the embodiment of FIG. 4o), the membrane holder 80 is fastened to a further part of the lithography device 16. The positioning elements 90 are fastened to the objective stage 20 and allow the portion 120 of the membrane 100 penetrated by the light to be moved axially in a synchronous fashion with the movement of the objective stage 20. In this case, the membrane holder 80 can be fastened using actuators 180 and/or by one or more rigid fastening elements.

In the embodiment of FIG. 4p), the membrane holder 80 is fastened to a further part of the lithography device 16. The positioning elements 90 comprise actuators 91, which are fastened to the objective stage 20 and which facilitate an axial movement of the portion 120 of the membrane 100 penetrated by the light in relation to the objective 40.

In the embodiment of FIG. 4q), the membrane holder 80 is fastened to a further part of the lithography device 16. The positioning elements 90 are fastened to the objective 40 and allow the portion 120 of the membrane 100 penetrated by the light to be moved axially in a synchronous fashion with the movement of the objective 40. In this case, the membrane holder 80 can preferably be fastened using actuators 180 and/or by one or more rigid fastening elements.

In the embodiment of FIG. 4r), the membrane holder 80 is fastened to a further part of the lithography device 16. The positioning elements 90 comprise actuators 91, which are fastened to the objective 40 and which facilitate an axial movement of the portion 120 of the membrane 100 penetrated by the light in relation to the objective 40.

In the embodiment of FIG. 4s), the membrane holder 80 is fastened to a further part of the lithography device 16. The positioning elements 90 comprise actuators 91, which are fastened to the object carrier 50 and which facilitate an axial movement of the portion 120 of the membrane 100 penetrated by the light.

In the embodiment of FIG. 4t), the membrane holder 80 is fastened to a further part of the lithography device 16. The positioning elements 90 comprise actuators 91, which are fastened to the same part of the lithography device 16 or to a further part of the lithography device 17 and which facilitate an axial movement of the portion 120 of the membrane 100 penetrated by the light.

FIG. 5 shows a schematic illustration of a device comprising a plurality of apparatuses 10, each of which can carry out a selected function. In a first device 200 embodied as a handling unit for immersion media, the immersion medium, for example in the form of an immersion liquid 160, can be applied to the object 60 using a dispensing unit 35. The handling unit 200 for immersion media can further be configured to surround the object provided with an immersion liquid 160 with an object transport unit 55, which is preferably configured as a closed container and which, for example, comprises a membrane holder 80, a membrane 100, an object carrier 50, and a fastening element 181, wherein alternative or additional use can be made of a movable element or an actuator 180 for fastening the membrane holder 80 to the object carrier 50. The object 60 or the object transport unit 55 can be transported under normal ambient conditions from the handling unit 200 to the lithography unit 220 using a conveyor system 210. In the lithography unit 220, a further index liquid 170 can optionally be applied between the membrane 100 and the objective 40 using a dispenser unit 30, before a processing of the object 60 and/or an optical characterization of the object 60 are carried out. In the case of lithographic processing, the object 60 or the object transport unit 55 can be transferred to a separate developer unit 230 using a further conveyor system 210 in a further step. In the developer unit 230, the object transport unit 55 can be reopened in order to remove non-polymerized parts of the photoresist from the object 60 using a rinsing unit 235. Other embodiments of the device comprising a plurality of apparatuses 10 and their respective function are possible.

The device schematically illustrated in FIG. 5 sketches a special case of an application of the apparatus 10 according to the invention and of a technical implementation of the method according to the invention, wherein the development steps following the lithographic processing need not necessarily be included. Since a particular advantage of the membrane 100 used according to the invention lies in sealing the volume of the immersion liquid 160 toward the objective 40, the membrane 100 can serve as protection for the immersion liquid 160 and the object 60 at the same time. Hence, the membrane 100 can adopt the function of a cover, which can preferably protect the object 60 and the immersion liquid in contact therewith from contamination, from contact with oxygen or with moisture in the air, or from unintentional exposure by short wavelength ambient light. In particular, the membrane can also be electrically conductive and protect the components from electrostatic discharge (ESD). To protect the object 60 and the immersion liquid 160 in contact therewith, these can be placed in an object transport unit 55, which, by way of the application of the membrane 100 and/or the membrane holder 80, is configured to be a container that is sealed to the best possible extent. The exemplary container schematically illustrated in FIG. 5 in this case comprises the object carrier 50, the fastening element 181 which is integrated in a sidewall 52 of the object carrier 50 or which forms said sidewall, the membrane holder 80, and the membrane 100, wherein the container is configured to receive the object 60 and the immersion liquid 160. A clear space remaining in the container can optionally be filled with a protective gas in order to avoid contact between the immersion liquid 160 and oxygen or moisture present in the ambient atmosphere. By using the object transport unit 55 with a protective function, the individual steps for optically characterizing or processing the object 60 can be carried out in functional units that are spatially separated from one another, wherein the object 60, together with the immersion liquid 160, is preferably transferable under normal ambient conditions between the functional units so that, as mentioned above, there is no need for particular requirements in respect of cleanliness (e.g., cleanroom classes), exposure (e.g., so-called yellow light surroundings), atmospheric boundary conditions (e.g., regulated humidity), and/or ESD protection in the traversed spatial region. The transfer of the object 60 protected by the membrane 100 between the various functional units is particularly advantageous in view of the design of industrial manufacturing systems, since a specialist device can be used for each step and since, in particular, this allows the optical lithography processes to be separated from wet chemical processes.

FIG. 6 shows results of a simulation of the imaging quality of the apparatus 10 according to the invention. In this case, the apparatus 10 comprises the objective 40 and the membrane 100, which separates two different immersion liquids, for example a photoresist 160 and an immersion liquid 170, from one another. Within the scope of the simulation, focusing of the light 140 was simulated by ray optics on the object side and represented by a so-called "spot diagram". The spot diagram shows the position of various rays of a beam in the focal plane of the objective 40. The region within the respectively plotted solid circle denotes the diffraction limit. In the simulation of FIG. 6a), the refractive index 1.52 of both immersion liquids 160, 170 is well-matched to the objective 40, and so a diffraction limited focus is almost obtained. In the simulation of FIG. 6b), there is an intentional or unintentional change in the refractive index of the immersion liquid 160 to 1.53, for example as a result of aging or due to the use of a different substance with a slightly deviating composition. In the case of the same position of the membrane 100, the focus has now become significantly larger and is no longer diffraction-limited. However, by displacing the membrane 100 in accordance with the simulation of FIG. 6c), it is possible to once again obtain a diffraction-limited focus and the change of the refractive index to 1.53 can be compensated for therewith. Thus, an optimal setting of the axial position of the membrane 100 allows aberrations to be compensated for, for example aberrations arising from slight variations of the refractive index of the photoresist that is used as immersion medium in the case of lithography.

FIG. 7 shows a schematic illustration of a further, preferred exemplary embodiment of the apparatus 10 according to the invention, which has a second membrane 105 that is fastened to a second membrane holder 85. In this case, a further immersion liquid 175 is used in addition to the immersion liquid 170 or the combination of the photoresist 160 and the immersion liquid 170. The immersion liquids 170, 175 and the photoresist 160 can have different refractive indices, dispersion characteristics and/or viscosities, as a result of which additional degrees of freedom are enabled during the compensation of aberrations. At least one of the membranes 100, 105 can be positioned in the axial direction by the at least one positioning element 90.

FIG. 8 shows a schematic illustration of a further, preferred exemplary embodiment of the apparatus 10 according to the invention, in which forces for deforming and for axially positioning the membrane 100 or the light-penetrated portion 120 of the membrane 100 are introduced by way of a positioning element 95, which is connected to the objective stage 20 or to the objective 40. Rollers or sliding surfaces on the contact points 96 between the positioning element 95 and the membrane 100 can ensure low friction in the case of a lateral movement of the membrane 100 relative to the positioning elements 95.

FIG. 9 shows a schematic illustration of a further, preferred exemplary embodiment of the apparatus 10 according to the invention, in which the membrane holder 80 is fastened to the objective stage 20. In this case, the membrane holder 80 comprises an arrangement of rollers and/or sliding surfaces 85, which are fastened to the objective stage 20 by fastening elements 185 and which facilitate an automated removal and supply of further regions, in particular cleaner regions, of the membrane 110. The axial positioning of the light-penetrated portion 120 of the membrane 100 can be implemented by way of a mechanism in the membrane holder 80 in this case, for example by tensioning the rollers 85. As an alternative or in addition thereto, use can be made of positioning elements 90 in order to set the axial position of the light-penetrated portion 120 of the membrane.

FIG. 10 shows a schematic illustration of a further, preferred exemplary embodiment of the apparatus 10 according to the invention, in which the membrane holder 80 is likewise fastened to the objective stage 20. This can preferably facilitate the use of various objectives 40, 41, 42, which are exchangeable using a revolver mechanism 45, for example, without this changing the position of the membrane 100. The light-penetrated portion 120 of the membrane 100 can be positioned by way of movable elements 180 or actuators. A further immersion liquid 170 that is optionally used between the membrane 100 and the respective objective 40, 41, or 42 in use can be supplied following an exchange of the objective 40, 41, or 42 by way of a dispenser unit (not illustrated) that is integrated in the lithography unit 220.

FIG. 11 shows a schematic illustration of a further, preferred exemplary embodiment of the apparatus 10 according to the invention, which comprises a solid photoresist 161 which covers the object 60. What emerges from FIG. 11a) is that a first index liquid 160, which is matched to the refractive index of the solid photoresist, represents a defined optical interface together with the membrane 100 so that the light 140 can be input coupled via a dry objective. According to FIG. 11b), a further immersion liquid 170 can be used between the membrane and the objective 40 in order to attain a high NA and/or in order to compensate for aberrations arising from a refractive index mismatch. As an alternative or in addition thereto, the further immersion liquid 170 can also have a viscosity that differs from that of the first index liquid 160.

FIG. 12 shows a schematic illustration of a further, preferred exemplary embodiment of the apparatus 10 according to the invention, in which the membrane 100 has lateral structuring 110. The lateral structuring 110 of the membrane 100 can be used to optimize wetting properties of the membrane 100 in respect of one or more immersion liquids 160, 170. In a further embodiment, one or more guide elements 115 can be used to curtail a lateral spread of the immersion liquid 170.

FIG. 13 shows a schematic illustration of a preferred exemplary embodiment of an arrangement for a preferred membrane holder 300 and its positioning. The exemplary embodiment of FIG. 3 is based on the exemplary embodiment of FIG. 4b, with rigid fastening elements 181 being used here in place of the actuators 180. A membrane 100, which is preferably provided in the form of a thin film (not illustrated here), is placed over an inner ring 330. In this case, an outer ring 340 is placed over the inner ring 330 for fixing the membrane 100. The conic surfaces 345 in the inner ring 330 and on the outer ring 340 allow films with different thicknesses to be tensioned. In this case, the outer ring 340 is fixed to the inner ring 330 by clamping or by screws in corresponding threaded holes 350, for example. A further clamping apparatus 310 can serve to fasten the membrane holder 300 to the objective stage 20. Rigid webs 320 can connect the clamping apparatus 310 to the inner ring 330 of the membrane holder 300. The clamping apparatus 310 which is open on one side allows the holder 300 and the membrane 100 to be replaced, without needing to remove the objective 40. The membrane holder 300 can simply be pushed over the objective stage 20 in order thus to position the membrane 100 under the objective 40. The membrane holder 300 is formed by the rings 330, 340 while the webs 320 represent the rigid fastening elements 181. The axial positioning of the light-penetrated portion 120 of the membrane 100 is implemented here either by the membrane holder 300 on its own or by the edge 47 or the ridgelines 500 of the objective 40.

The exemplary embodiment of FIG. 13 can be extended to the effect of one of the fastening elements 181 or the objective stage 20 being provided with a sensor (not illustrated), using which possible collisions of the membrane holder 300 or of the membrane 100 with the object 60 or the object carrier 50 can be captured before the substantially more sensitive objective 40 is contacted or damaged. By way of example, unwanted contact or an unwanted collision between two components can be detected by a mechanical sensor or by an electrical sensor, which preferably can capture an electrical resistance between the two components and can identify contact or collision by way of a reduction in the electrical resistance. The use of a membrane 100 with a sufficient electrical conductivity can lend itself to this process, said membrane facilitating a detection of contact or a collision of the membrane with another subcomponent of the apparatus 10.

FIG. 14 shows a schematic illustration of a further, preferred exemplary embodiment 400 of the apparatus 10 according to the invention. In this case, the object 60 is situated on an object carrier 50, which can be covered by a membrane 100 which is tensioned in a ring holder 420. The plan view of FIG. 14a) shows this embodiment prior to assembly. In the plan view of FIG. 14b), the membrane 100 together with the object carrier 50 form an object transport unit 55 embodied as a closed container, which is able to protect the object 60 and the immersion liquid 160 previously applied to the object 60 from ambient influences. FIG. 14c) shows a cross section through the apparatus 10 according to the invention, in which the at least one positioning element 90 is able by way of an elastic deformation of the membrane 100 to set an optimal working distance between the object 60, the objective 40, and the membrane 100. In an alternative embodiment (not illustrated), the axial positioning of the light-penetrated portion 120 of the membrane 100 can also be achieved by the edge 47 or the ridgelines 500 of the objective 40, and so it is possible to dispense with additional positioning elements 90 that are attached to the objective 40.

On the basis of the illustration in FIG. 14, it is possible to sketch out an exemplary embodiment for a use of the method according to the invention in 3D lithography. The object 60 is fastened to the object carrier 50 according to step a). According to step b), a photoresist as the immersion medium 160 for two-photon polymerization is applied to the object 60 in a first functional unit. This is implemented manually or using a separate dispenser 35, which can additionally provide an inert gas atmosphere. Following the application of the immersion liquid, the membrane 100, which is fastened to a ring holder 420, is attached to the object carrier 50 in the first functional unit, according to step c), in a manner that the latter is preferably sealed in air-tight fashion. As a result, in a manner analogous to the exemplary embodiment according to FIG. 5, an object transport unit 55 is provided, which is able to protect the object 60 from the ambient atmosphere. If use is made of a membrane 100 that is not transparent in the UV range, the object 60 can also be transported through regions in which no pure yellow light illumination is provided. If use is made of an electrically conductive membrane 100, the object 60 can also be transported through regions which are not ESD-protected; to this end, the object transport unit 55 should be designed accordingly. Following this, the object carrier 50 with the membrane 100 is transferred into a further functional unit which is embodied as a lithography unit 220, in which the lithographic processing and/or the optical characterization occurs. The object transport unit 55 continues to be closed in this functional unit and, optionally, a second immersion liquid 170 is applied between the membrane 100 and the objective 40. Thereafter, the objective 40 is caused to approach the membrane 100 according to step d). Since the ring holder 420 has a greater diameter than the objective 40, the light-penetrated portion 120 of the membrane 100 can be brought, synchronously with the axial movement of the objective 40, into an advantageous position between the object 60 and the objective 40 by the positioning elements 90, which are fastened to the objective 40 in this case. Once the desired axial position between the objective 40 and the object 60 has been reached according to step e), the processing and/or characterization of the object 60 can now be implemented according to step f), wherein the processing can comprise 3D patterning using 3D lithography, in particular. Partial steps e) and f), which comprise the positioning of the membrane 100 and the patterning of the object 60, can be carried out once or multiple times, for example at different positions of the object 60 and hence at different positions of the membrane 100. After the 3D lithography has been implemented according to step f), the object transport unit 55 remains closed and is transferred to a further functional unit embodied as a developer unit 230. In this functional unit, the membrane 100 with the ring holder 420 can be taken away and the non-polymerized photoresist can be removed in a development process.

LIST OF REFERENCE SIGNS

10 Apparatus
15 Optical characterization or processing unit (lithography unit)
16, 17 Further part of the lithography unit
20 Objective stage
30 Dispenser unit
40, 41, 42 Objective
45 Revolver mechanism
46 End face
47 Edge
48 Exit window
49 Mount
50 Object carrier
51 Object stage
52 Sidewall of the object carrier
55 Object transport unit
60 Object
61 Multi-chip module
65, 66, 67 Partial object
68 Base plate
69 Surface of the object
80, 85 Membrane holder
81 First contact point
85 Rollers and/or sliding surfaces
90, 95 Positioning element
91 Actuator
96 Second contact point
100, 105 Membrane
110 Lateral structuring
115 Guide element
120 Light-penetrated portion
130 Part of the object
140 (Laser) light
160, 170, 175 Immersion medium (immersion liquid, photoresist)
161 Solid photoresist
180 Movable element (actuator)
181, 185 Fastening element
200 Dispenser
210 Conveyor system
220 Lithography unit
230 Developer unit
235 Rinsing unit
300 Membrane holder
310 Clamping apparatus
320 Web
330 Inner ring
340 Outer ring
345 Conic surfaces
350 Threaded hole
400 Further preferred exemplary embodiment
420 Ring holder
500 Ridgeline
501 Ridge point
502 Optical axis
503 Half-plane
504 Contour
510 Lateral surface

The invention claimed is:

1. An apparatus for optically processing an object, comprising
an object carrier for receiving an object;
an optical processing unit, comprising
at least one device for producing light and an objective for exposing the object using the light or for capturing the light from the object, wherein the objective has an end face facing the object carrier, wherein the end face has an edge, wherein the objective further defines an optical axis;
at least one membrane introduced between the objective and the object carrier, wherein the membrane has a portion configured for penetration by the light, wherein at least the portion of the membrane is movable in the axial direction with respect to the optical axis,
at least one membrane holder for holding the at least one membrane, and
at least one immersion medium which is at least introduced between the membrane and
the object carrier, wherein the immersion medium comprises a photosensitive material,
wherein the membrane and the membrane holder are fastened at a point outside of the objective, and wherein the membrane is arranged at the membrane holder in a manner that first contact points between the membrane and the membrane holder are located on or outside a lateral surface which is formed by a geometric extrusion of the edge of the objective parallel to the optical axis.

2. The apparatus of claim 1, wherein the membrane holder is connected to at least one of: an objective stage that is formed to receive the objective;
an object stage that is formed to receive the object carrier;
the object carrier; or
a further part of the optical processing unit.

3. The apparatus of claim 1, wherein the objective has such an exchangeable setup that the objective is able to be exchanged while the membrane holder and the membrane remain at the apparatus.

4. The apparatus of claim 1, further comprising at least one positioning element, wherein the positioning element is configured to move the membrane in the axial direction with respect to the optical axis.

5. The apparatus of claim 4, wherein the positioning element is arranged in a manner that second contact points between the membrane and the positioning element are located on or outside of the lateral surface which is formed by the geometric extrusion of the edge of the objective.

6. The apparatus of claim 4, wherein the membrane holder or a part of the objective is simultaneously embodied as the positioning element.

7. The apparatus of claim 4, wherein the positioning element is connected to at least one of:
an objective stage;
an object stage;
the object carrier; or
the further part of the optical processing unit.

8. The apparatus of claim 4, wherein at least one of the membrane holder or the positioning element comprises fastening elements which are configured to move the membrane in the lateral direction between the objective and the object by way of at least one of rollers or sliding surfaces.

9. The apparatus of claim 1, wherein the membrane or the membrane holder is elastically or plastically deformable in a manner that the portion of the membrane is movable in the axial direction as a result thereof.

10. The apparatus of claim 1, wherein a working distance of no more than 5 mm is configured between the end face of the objective and a surface of the object.

11. The apparatus of claim 1, wherein the membrane separates the immersion medium and a further immersion medium from one another.

12. The apparatus of claim 11, wherein a refractive index of the further immersion medium differs from the refractive index of the immersion medium, or
   wherein a viscosity of the further immersion medium differs from the viscosity of the immersion medium, or
   wherein the photosensitivity of the further immersion medium differs from the photosensitivity of the immersion medium.

13. A method for optical processing of an object using the apparatus of claim 1 for optically processing an object, comprising the following steps:
   a) positioning at least one object on an object carrier;
   b) applying an immersion medium to at least part of the object, wherein the immersion medium comprises a photosensitive material;
   c) approaching a membrane to the part of the object covered with the immersion medium, wherein the membrane has a transparent portion provided for light to penetrate;
   d) positioning an objective, which defines an optical axis, relative to the part of the object covered by the immersion medium;
   e) setting an axial position for the portion of the membrane with respect to the optical axis; and
   f) optically processing the object using the light.

14. The method of claim 13, wherein axial positioning of the portion of the membrane penetrated by the light is implemented together with the positioning of the objective in a synchronized movement.

15. The method of claim 13, wherein steps a) to c) are carried out in a handling unit for immersion media, which is configured to introduce the immersion medium used between the membrane and the object, wherein an object transport unit at least comprising the object carrier, the membrane, and a membrane holder configured to hold the membrane is subsequently transferred to a lithography unit which at least comprises an optical processing unit, and wherein steps d) to f) are carried out in the lithography unit.

* * * * *